(12) United States Patent
Lin et al.

(10) Patent No.: US 11,362,038 B2
(45) Date of Patent: Jun. 14, 2022

(54) PHOTOLITHOGRAPHY ALIGNMENT PROCESS FOR BONDED WAFERS

(71) Applicant: Taiwan Semiconductor Manufacturing Co., Ltd., Hsin-Chu (TW)

(72) Inventors: Yeong-Jyh Lin, Caotun Township (TW); Ching I Li, Hsinchu (TW); De-Yang Chiou, Hsinchu (TW); Sz-Fan Chen, Kaohsiung (TW); Han-Jui Hu, Tainan (TW); Ching-Hung Wang, Hsinchu (TW); Ru-Liang Lee, Hsinchu (TW); Chung-Yi Yu, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 32 days.

(21) Appl. No.: 17/062,677

(22) Filed: Oct. 5, 2020

(65) Prior Publication Data

US 2021/0375781 A1 Dec. 2, 2021

Related U.S. Application Data

(60) Provisional application No. 63/030,990, filed on May 28, 2020.

(51) Int. Cl.
*H01L 23/544* (2006.01)
*H01L 21/027* (2006.01)
*H01L 21/683* (2006.01)
*G03F 1/42* (2012.01)
*G03F 1/70* (2012.01)
*H01L 21/66* (2006.01)

(52) U.S. Cl.
CPC ............. *H01L 23/544* (2013.01); *G03F 1/42* (2013.01); *G03F 1/70* (2013.01); *H01L 21/0274* (2013.01);
(Continued)

(58) Field of Classification Search
CPC ............... H01L 23/544; H01L 21/0274; H01L 21/6835; H01L 22/20; H01L 2221/68309; H01L 2223/54426; G03F 1/42; G03F 1/70
(Continued)

(56) References Cited

U.S. PATENT DOCUMENTS 6,844,244 B2 * 1/2005 Best .................. G03F 9/708
438/460
7,105,381 B2 * 9/2006 Han .................. H01L 23/544
257/797

(Continued)

*Primary Examiner* — Vu A Vu
(74) *Attorney, Agent, or Firm* — Eschweiler & Potashnik, LLC

(57) ABSTRACT

Various embodiments of the present disclosure are directed towards a method for forming a semiconductor structure. The method includes forming a plurality of upper alignment marks on a semiconductor wafer. A plurality of lower alignment marks is formed on a handle wafer and correspond to the upper alignment marks. The semiconductor wafer is bonded to the handle wafer such that centers of the upper alignment marks are laterally offset from centers of corresponding lower alignment marks. An overlay (OVL) shift is measured between the handle wafer and the semiconductor wafer by detecting the plurality of upper alignment marks and the plurality of lower alignment marks. A photolithography process is performed by a photolithography tool to partially form an integrated circuit (IC) structure over the semiconductor wafer. During the photolithography process the photolithography tool is compensatively aligned according to the OVL shift.

20 Claims, 22 Drawing Sheets

(52) U.S. Cl.
CPC .......... *H01L 21/6835* (2013.01); *H01L 22/20* (2013.01); *H01L 2221/68309* (2013.01); *H01L 2223/54426* (2013.01)

(58) Field of Classification Search
USPC ............................................................ 438/5
See application file for complete search history.

(56) References Cited

U.S. PATENT DOCUMENTS

| | | | |
|---|---|---|---|
| 7,998,640 B2 * | 8/2011 | Li | H01L 23/544 |
| | | | 430/5 |
| 8,247,895 B2 * | 8/2012 | Haensch | H01L 24/83 |
| | | | 257/686 |
| 8,361,876 B2 * | 1/2013 | Ishimaru | G03F 9/7084 |
| | | | 438/401 |
| 9,316,925 B2 * | 4/2016 | Cai | G03F 7/70633 |
| 9,385,104 B2 * | 7/2016 | Tani | H01L 23/481 |
| 2012/0049186 A1 * | 3/2012 | Li | H01L 23/544 |
| | | | 257/48 |
| 2015/0380292 A1 | 12/2015 | Tachioka et al. | |
| 2017/0243853 A1 * | 8/2017 | Huang | H01L 24/94 |
| 2019/0355698 A1 * | 11/2019 | Guo | H01L 25/0657 |
| 2020/0055729 A1 * | 2/2020 | Wagenleitner | H01L 21/681 |
| 2020/0159133 A1 * | 5/2020 | Yan | H01L 23/544 |
| 2020/0219820 A1 * | 7/2020 | Chen | H01L 33/52 |

* cited by examiner

US 11,362,038 B2

PHOTOLITHOGRAPHY ALIGNMENT PROCESS FOR BONDED WAFERS

REFERENCE TO RELATED APPLICATION

This Application claims the benefit of U.S. Provisional Application No. 63/030,990, filed on May 28, 2020, the contents of which are hereby incorporated by reference in their entirety.

BACKGROUND

Integrated chips are fabricated in semiconductor fabrication facilities. Fabrication facilities contain processing tools that are configured to perform processing steps (e.g., etching steps, photolithography steps, deposition steps, etc.) upon a semiconductor substrate (e.g., a silicon wafer). Photolithography is a commonly used processing step by which a pattern of a photomask is transferred to the semiconductor substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5-7, 8A and 8B through 11A and 11B, 12A-12D, and 13-17 illustrate some embodiments of various views of a method for bonding a first IC structure to a handle wafer and forming a second IC structure over the first IC structure based on an OVL shift measured between the handle wafer and the first IC structure.

DETAILED DESCRIPTION

Figure 1A:
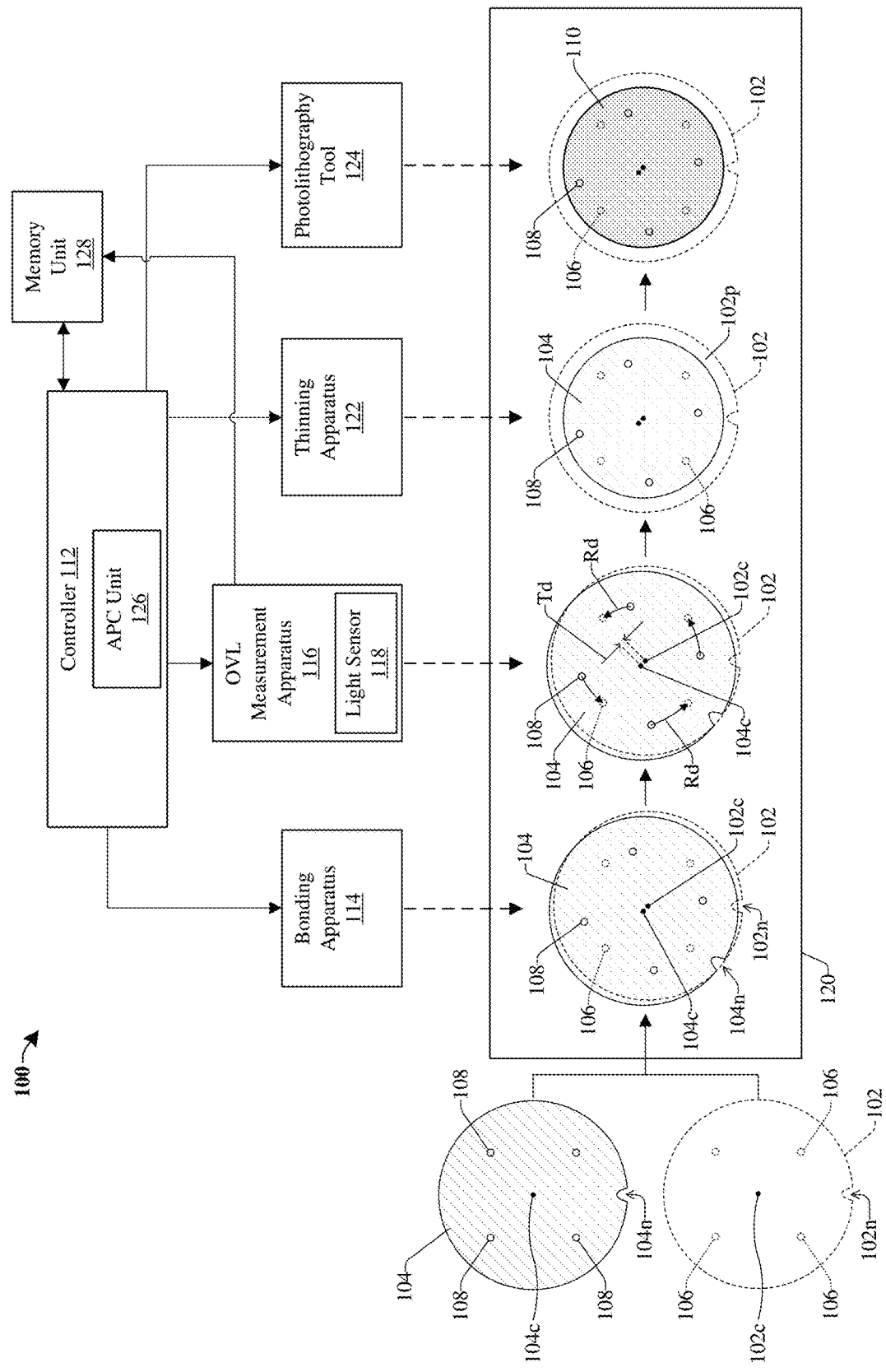
FIG. 1A illustrates some embodiments of a schematic representation of a processing system configured to perform a photolithography alignment process on a photolithography tool according to an overlay (OVL) shift measured between a plurality of lower alignment marks on a handle wafer and a plurality of upper alignment marks on a semiconductor wafer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element, but rather are merely generic identifiers. For example, "a first dielectric layer" described in connection with a first figure may not necessarily correspond to a "first dielectric layer" described in connection with some embodiments, but rather may correspond to a "second dielectric layer" in other embodiments.

A three-dimensional (3D) integrated circuit (IC) comprises a plurality of IC die that are stacked over one another. One possible method to manufacture a 3D IC includes a wafer stacking method that includes bonding a first 2D IC structure to a handle wafer and subsequently forming a second 2D IC structure over the first 2D IC structure. Forming the second 2D IC structure over the first 2D IC structure includes performing multiple processing steps in a fabrication facility. The processing step place patterned layers over the first 2D IC structure, and at least some of the patterned layers may be formed using a photolithography tool. In order for the 3D IC to operate correctly, the patterned layers of the second 2D IC structure should be aligned accurately with one another and with patterned layers of the first 2D IC structure. Misalignment between the patterned layers of the first and second 2D IC structures may cause short circuits or connection failures, which significantly impact device yield. When forming a patterned layer of the second 2D IC structure, the photolithography tool may be aligned according to a circumferential edge and/or a notch of the handle wafer to mitigate misalignment between patterned layers of the first and second 2D IC structures. With the increase in complexity and/or shrinkage of device features of ICs, accurate alignment becomes more important to prevent short circuits and/or connection failures between patterned layers of the first and/or second 2D IC structures. The first 2D IC structure may include a first interconnect structure disposed on a semiconductor wafer. A plurality of semiconductor devices may be disposed on/within the semiconductor wafer. Further, the semiconductor wafer and the handle wafer may each comprise a notch disposed along a circumferential edge and/or may each comprise one or more bonding alignment marks.

One challenge with the above 3D IC manufacturing method is misalignment between the first 2D IC structure and the handle wafer after the bonding process. For example, during the bonding process, a light sensor (e.g., an infrared (IR) sensor) is utilized to ensure the semiconductor wafer is aligned (e.g., optically-aligned) with the handle wafer by virtue of wafer features (e.g., the notch, the circumferential edge, and/or the bonding marks of the semiconductor and/or handle wafers). However, due to processing tool limitations, a misalignment distance between a center of the semiconductor wafer and a center of the handle wafer after the bonding process may be relatively large (e.g., greater than about 70 nanometers (nm)). The relatively large misalignment distance may result in inaccurate alignment during fabrication of patterned layers of the second 2D IC structure over the bonded semiconductor wafer and the handle wafer. This, in part, may result in short circuits and/or connection failures between the patterned layers of the second 2D IC structure and the semiconductor devices of the first 2D IC structure, thereby decreasing device yield. Failures as a result of the misalignment may be exacerbated as feature sizes of the first and second 2D IC structures shrink.

In another example, during the bonding process, the semiconductor wafer is disposed over the handle wafer by virtue of a wafer transport apparatus. The wafer transport apparatus comprises a plurality of wafer pins that may be configured to move along one or more tracks. The wafer pins are configured to guide the semiconductor wafer over the handle wafer and mechanically-align the semiconductor wafer over the handle wafer by virtue of wafer features (e.g., the notch and/or circumferential edge of the semiconductor and/or handle wafers). Thereafter, the semiconductor wafer is bonded to the handle wafer. A trimming process is performed on the semiconductor wafer to remove a peripheral region of the semiconductor wafer. This, in part, may remove the notch of the semiconductor wafer, thereby decreasing an ability to accurately measure misalignment between the notch of the handle wafer and the notch of the semiconductor wafer during subsequent processing steps. Subsequently, the photolithography tool may perform a coarse overlay measurement according to the trimmed semiconductor wafer and the notch/circumferential edge of the handle wafer, thereby measuring a misalignment distance between centers of the two wafers. Due to processing tool limitations of the wafer transport apparatus, the misalignment distance between the semiconductor wafer and the handle wafer may be substantially large (e.g., greater than about 44 micrometers (um)). This substantially large misalignment distance may be equal to or greater than a misalignment threshold of the photolithography tool, such that the bonded semiconductor and handle wafers are rejected for subsequent processing steps, thereby decreasing device yield.

Various embodiments of the present application are directed towards an improved method (and associated processing system) for manufacturing a 3D IC structure. The method utilizes a plurality of lower alignment marks disposed on a handle wafer, a plurality of upper alignment marks disposed on semiconductor wafer of a first 2D IC structure, and an overlay (OVL) measurement apparatus to facilitate fabrication of a second 2D IC structure over the first 2D IC structure. For example, the first 2D IC structure may include the semiconductor wafer, a first interconnect structure disposed on the semiconductor wafer, and a bonding structure disposed on the first interconnect structure. The plurality of upper alignment marks may be formed on the bonding structure, and the plurality of lower alignment marks may be formed on the handle wafer. Subsequently, the bonding structure is bonded to the handle wafer, for example, without performing optical-alignment between the handle wafer and semiconductor wafer before and/or during the bonding process. By omitting the optical-alignment, time and/or cost associated with the method may be reduced. Subsequently, the OVL measurement apparatus measures an OVL shift (e.g., a translation distance and/or a rotation shift) between centers of the handle wafer and the semiconductor wafer according to the upper and lower alignment marks. Further, multiple processing steps are performed to form the second 2D IC structure over the first 2D IC structure. A processing step may place a patterned layer over the first 2D IC structure, which may include utilizing a photolithography tool to form the patterned layer. Before performing the processing step, a photolithography alignment process is performed on the photolithography tool to compensate for the OVL shift. For example, the photolithography alignment process comprises shifting the photolithography tool (and an associated photomask) according to the measured OVL shift, such that the patterned layer of the second 2D IC structure is accurately aligned with layers of the first 2D IC structure. This, in part, decreases short circuits and/or connection failures between semiconductor devices of the first and second 2D IC structures, thereby increasing device yield.

FIG. 1A illustrates some embodiments of a schematic of a processing system 100 configured to perform a photolithography alignment process on a photolithography tool 124 according to an overlay (OVL) shift measured between a plurality of lower alignment marks 106 on a handle wafer 102 and a plurality of upper alignment marks 108 on a semiconductor wafer 104. According to the processing system 100, the handle wafer 102 and the semiconductor wafer 104 are configured to pass through a conveyor apparatus 120, where the wafers go through a set of semiconductor manufacturing processes.

In some embodiments, a circumferential edge of the handle wafer 102 is circular but for the presence of a notch 102n, and a circumferential edge of the semiconductor wafer 104 is circular but for the presence of a notch 104n. The notches 102n, 104n of the handle wafer 102 and the semiconductor wafer 104 may be configured as alignment notches. In yet further embodiments, before passing through the conveyor apparatus 120, the plurality of lower alignment marks 106 is formed on the handle wafer 102, and the plurality of upper alignment marks 108 is formed on the semiconductor wafer 104. In some embodiments, a number of lower alignment marks 106 disposed on the handle wafer 102 may, for example, be equal to a number of upper alignment marks 108 disposed on the semiconductor wafer 104. In some embodiments, each alignment mark within the plurality of lower alignment marks 106 are equidistant from a center 102c of the handle wafer 102 and/or each alignment mark within the plurality of upper alignment marks 108 are equidistant from a center 104c of the semiconductor wafer 104. In further embodiments, a diameter of the semiconductor wafer 104 is equal to a diameter of the handle wafer 102. In yet further embodiments, the semiconductor wafer 104 may, for example, be part of a first integrated circuit (IC) structure, where a first interconnect structure (not shown) is disposed on the semiconductor wafer 104. Further, a first plurality of semiconductor devices (e.g., transistors) may be disposed within and/or on the semiconductor wafer 104 and the first interconnect structure.

The wafers on the conveyor apparatus 120 first pass through a bonding apparatus 114. The bonding apparatus 114 is configured to bond the semiconductor wafer 104 to the handle wafer 102, such that the semiconductor wafer 104 overlies the handle wafer 102. The handle wafer 102 may be configured to increase structural integrity of the semiconductor wafer 104 and/or other semiconductor devices formed over the semiconductor wafer 104 in subsequent processing steps. In some embodiments, the bonding apparatus 114 is configured to perform the bonding process without performing an optical-alignment process (e.g., an optical-alignment process utilizing a light sensor) before and/or during the bonding operation. Thus, in various embodiments, the notch 104n of the semiconductor wafer 104 is laterally offset from the notch 102n of the handle wafer 102 by a non-zero distance after performing the bonding process. In addition, the upper alignment marks 108 disposed on the semiconductor wafer 104 may, for example, be laterally offset from corresponding lower alignment marks 106 disposed on the handle wafer 102 by one or more non-zero distances after the bonding process. In yet further embodiments, the bonding apparatus 114 may comprise a transport apparatus (1003 of FIG. 10B) (not shown) configured to perform a mechanical-alignment process on the handle wafer 102 and the semiconductor wafer 104 via a plurality of wafer pins (1006a-c of FIG. 10B) before performing the bonding process.

A controller 112 is configured to control the bonding apparatus 114 and other components of the processing system 100. A two way connection exists between the controller 112 and a memory unit 128, so that the controller 112 can provide data to the memory unit 128 as well as adjust actions of other devices connected to the controller 112, based at least in part on the information provided by the memory unit 128. The memory unit 128 may include any type of storage device configured to store data, programs, and/or other information. In some embodiments, the memory unit 128 may include, for example, one or more of a hard disk drive, a magnetic disk drive, an optical disk drive, another suitable storage device, or any combination of the foregoing. The controller 112 comprises an automatic process control (APC) unit 126. In another embodiment, the controller 112 may also include an application programming interface (API) (not shown). In some embodiments, the APC unit 126 provides stable processing conditions and adjusts device properties, whereas the API provides unified interface for accessing and interacting with the memory unit 128.

In some embodiments, after undergoing the bonding process, the semiconductor wafer 104 and the handle wafer 102 passes to an OVL measurement apparatus 116. The OVL measurement apparatus 116 includes a light sensor 118 and is configured to perform an OVL measurement on the bonded wafers. The OVL measurement apparatus 116 has an output going to a memory unit 128 as well as an input coming from the controller 112, such that the OVL measurement may be saved in the memory unit 128 after performing the measurement process. In various embodiment, the OVL measurement apparatus 116 is configured to measure and/or determine an OVL shift (e.g., a translation distance and/or a rotation shift) between the handle wafer 102 and the semiconductor wafer 104 by detecting a location of each lower and upper alignment mark 106, 108. In some embodiments, the OVL measurement apparatus 116 is configured to measure the OVL shift by determining a location of the center 102c of the handle wafer 102 by virtue of the plurality of lower alignment marks 106 and determining a location of the center 104c of the semiconductor wafer 104 by virtue of the plurality of upper alignment marks 108. For example, the OVL measurement apparatus 116 may measure and/or determine a translation distance Td that corresponds to a translation shift between the centers 102c, 104c of the handle wafer 102 and the semiconductor wafer 104. In further embodiments, the OVL measurement apparatus 116 may measure and/or determine rotational shifts Rd between each lower alignment mark 106 and a corresponding upper alignment in the plurality of upper alignment marks 108. In further embodiments, the OVL measurement apparatus 116 is configured to measure the OVL shift by way of a light sensor 118 that emits light (e.g., visible light and/or IR light) from the semiconductor wafer 104 to the handle wafer 102, or vice versa. Thus, the light sensor 118 may detect and/or determine a location of each alignment mark in the plurality of lower alignment marks 106 and the plurality of upper alignment marks 108 based on the alignment marks and one or more reference locations (e.g., the centers 102c, 104c, the notches 102n, 104n, and/or circumferential edges of the handle wafer 102 and/or the semiconductor wafer 104). The controller 112 receives the OVL measurement (e.g., the translation distance Td and/or the rotation shift Rd) from the memory unit 128. Subsequently, the APC unit 126 may tune parameters of other processing components based on the OVL measurement. For example, the APC unit 126 may adjust parameters of a photolithography tool 124 during subsequent processing steps based on the OVL measurement.

In various embodiments, after the bonding process, the semiconductor wafer 104 and the handle wafer 102 are passed to a thinning apparatus 122. The thinning apparatus 122 is configured to perform a thinning process and/or a trimming process on the semiconductor wafer 104. For example, during the thinning process, the thinning apparatus 122 may reduce a thickness of the semiconductor wafer 104 by way of a planarization process (e.g., a chemical mechanical polishing (CMP) process), a mechanical grinding process, another suitable thinning process, or any combination of the foregoing. In further embodiments, during the trimming process, the thinning apparatus 122 may remove a peripheral region of the semiconductor wafer 104 that overlies a peripheral region 102p of the handle wafer 102. In such embodiments, during the trimming operation, the notch 104n of the semiconductor wafer 104 may be removed and/or a diameter of the semiconductor wafer 104 may be reduced. In yet further embodiments, the OVL measurement is performed after the thinning process and/or the trimming process.

After performing the thinning process and/or the trimming process, the semiconductor wafer 104 and the handle wafer 102 are moved to a photolithography tool 124. In some embodiments, the APC unit 126 is configured to perform a photolithography alignment process on the photolithography tool 124 according to the measured OVL shift. In such embodiments, the APC unit 126 is configured adjust parameters of the photolithography tool 124. For example, the APC unit 126 may laterally shift and/or rotationally shift a field of view of the photolithography tool 124 and/or a photomask of the photolithography tool 124 by the translation distance Td and/or the rotation shift Rd. This, in part, compensates for the measured OVL shift. Thus, the photolithography tool 124 is aligned according to the lower and upper alignment marks 106, 108. In some embodiments, the photolithography alignment process is referred to as a calibration process.

In addition, multiple processing steps may be performed to form a second IC structure 110 over the semiconductor wafer 104. In some embodiments, the second IC structure 110 may, for example, comprise a second interconnect structure (not shown) over the semiconductor wafer 104 that comprises a plurality of patterned layers. For example, the second IC structure 110 may comprises a second plurality of semiconductor devices disposed on and/or over the semiconductor wafer 104. A processing step may place a patterned layer over the semiconductor wafer 104, which may include utilizing the photolithography tool 124 to form the patterned layer. For example, the photolithography tool 124 may be configured to perform one or more photolithography processes to form a patterned layer. In various embodiments, the photolithography tool 124 may comprises one or more photomasks (not shown) and each of the photomask(s) may comprise a pattern for a corresponding patterned layer of the second IC structure 110. By virtue of the photolithography alignment process, the photolithography tool 124 may, for example, shift a position of each photomask (e.g., before performing a corresponding photolithography process) according to the measured OVL shift (e.g., the translation distance Td and/or the rotational shift Rd), such that the pattern of each patterned layer formed using the photolithography tool 124 is aligned according to the lower and upper alignment marks 106, 108. Thus, patterned layers of the second IC structure 110 are aligned with layers of the first IC structure, thereby mitigating short circuits and/or connection failures between layers of the first IC structure and patterned layers of the second IC structure 110.

It should be noted that the modules and devices in FIG. 1A may all be implemented on one or more processor-based systems. Communication between the different modules and devices may vary depending on how the modules are implemented. If the modules are implemented on one processor-based system, data may be saved in the memory unit 128 between the execution of program code for different steps by the controller 112. The data may then be provided by the controller 112 accessing the memory unit 128 via a bus during the execution of a respective step. If modules are implemented on different processor based systems or if data is to be provided from another storage system, such as a separate memory unit, data can be provided between the systems through an input/output (I/O) interface or a network interface. Similarly, data provided by the devices or stages may be input into one or more processor-based system by the I/O interface or network interface. Thus, it will be appreciated that other variations and modifications in implementing systems and methods are within the scope of the disclosure.

Figure 1B:
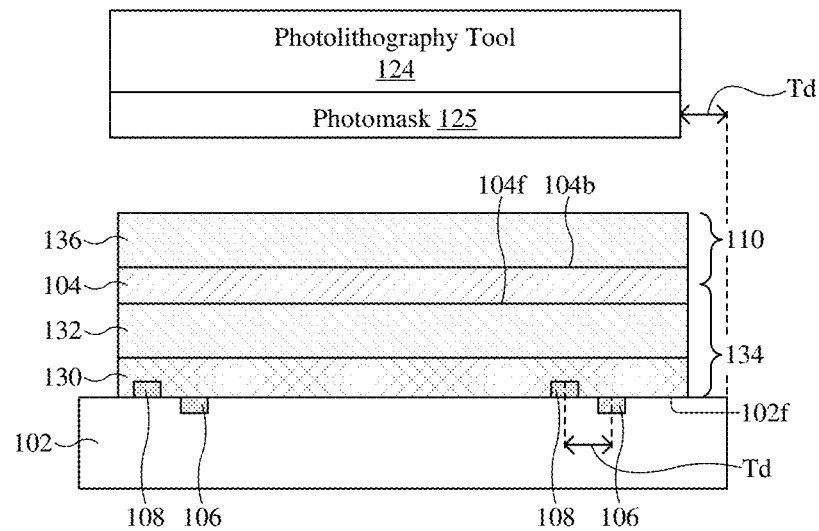
FIG. 1B illustrates some embodiments of a cross-sectional view of a handle wafer having a plurality of lower alignment marks bonded to a semiconductor wafer by way of a bonding structure having a plurality of upper alignment marks.

FIG. 1B illustrates some embodiments of a cross-sectional view of a handle wafer 102 having a plurality of lower alignment marks 106 bonded to a semiconductor wafer 104 by way of a bonding structure 130 having a plurality of upper alignment marks 108.

The semiconductor wafer 104 may be part of a first IC structure 134. In some embodiments, the first IC structure 134 comprises at least a portion of the semiconductor wafer 104, a first interconnect structure 132 disposed along a front-side surface 104f of the semiconductor wafer 104, and a bonding structure 130 disposed along the first interconnect structure 132. In some embodiments, a first plurality of semiconductor devices (not shown) may be disposed within and/or on the semiconductor wafer 104 and/or the first interconnect structure 132. The semiconductor wafer 104 is bonded to the handle wafer 102 by way of the bonding structure 130, such that the handle wafer 102 and the bonding structure 130 meet at a bond interface.

In some embodiments, the plurality of lower alignment marks 106 are disposed along a front-side surface 102f of the handle wafer 102, and the plurality of upper alignment marks 108 are disposed along a bottom surface of the bonding structure 130. In various embodiments, the plurality of upper alignment marks 108 and the lower alignment marks 106 are laterally offset from one another, for example, by an OVL shift that may include a translation distance Td (as illustrated and/or described in FIG. 1A). This, in part, may be due to limitations in processing tools utilized to bond the handle wafer 102 to the semiconductor wafer 104. In yet further embodiments, the upper alignment marks 108 may be offset from a corresponding lower alignment mark 106 by a rotation shift (not shown). In further embodiments, the OVL shift may be determined and/or measured by an OVL measurement apparatus (e.g., the OVL measurement apparatus 116 of FIG. 1A) after bonding the handle wafer 102 to the semiconductor wafer 104.

In addition, a second IC structure 110 overlies the first IC structure 134. In some embodiments, the second IC structure 110 comprises a portion of the semiconductor wafer 104 and/or a second interconnect structure 136 that comprises a plurality of patterned layers. Multiple processing steps may be performed to form the second IC structure 110 over the first IC structure 134. Photolithography/etching processing steps may, for example, place patterned layers over the first IC structure 134, which may include utilizing a photolithography tool 124 to form the patterned layers. The photolithography tool 124 is configured to perform a photolithography process to form the patterned layers according to the OVL shift measured by the OVL measurement apparatus. For example, the photolithography tool 124 may be configured to shift one or more photomask(s) 125 according to the measured OVL shift (e.g., the translation distance Td), such that a pattern of each patterned layer is aligned according to the plurality of lower alignment marks 106 and the plurality of upper alignment marks 108. This, in part, facilitates patterned layers of the second IC structure 110 being aligned with layers of the first IC structure 134, thereby mitigating short circuits and/or connection failures between semiconductor devices of the first IC structure 134 and patterned layers of the second IC structure 110.

Figure 2A:
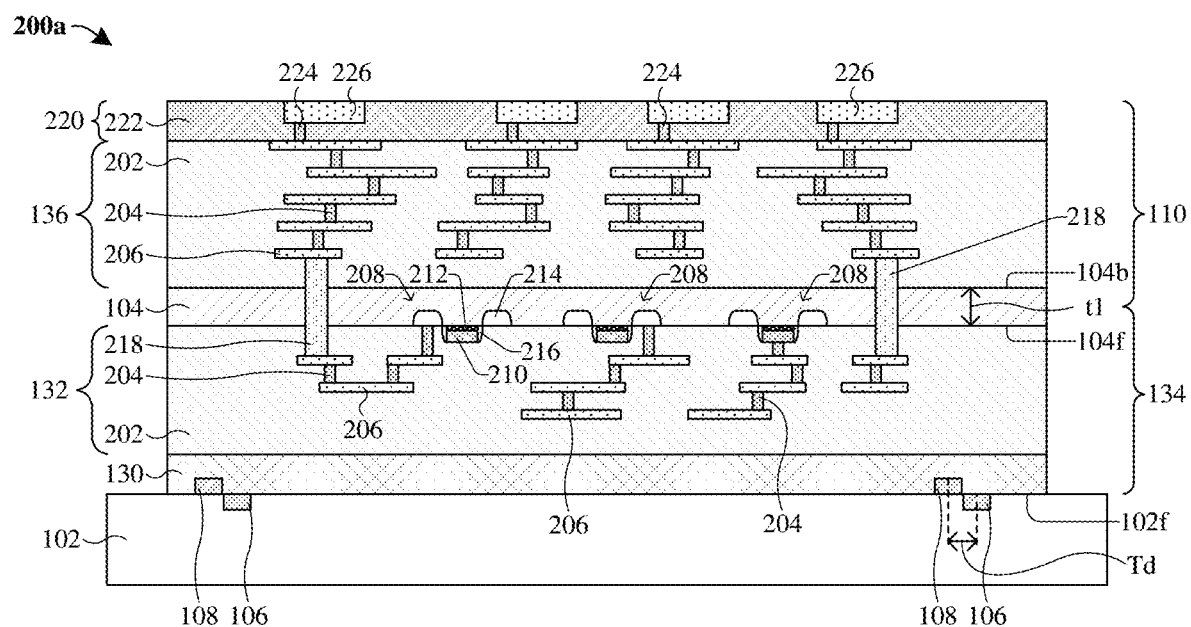
FIGS. 2A-2K and 3A-3B illustrate various embodiments of cross-sectional views of a three-dimensional (3D) integrated circuit (IC) structure comprising a first IC structure disposed between a handle wafer and a second IC structure.

FIG. 2A illustrates some embodiments of a cross-sectional view of a three-dimensional (3D) integrated circuit (IC) structure 200a comprising a semiconductor wafer 104 bonded to a handle wafer 102.

The 3D IC structure 200a includes a first IC structure 134 overlying the handle wafer 102 and a second IC structure 110 overlying the first IC structure 134. In some embodiments, the handle wafer 102 and/or the semiconductor wafer 104 may, for example, respectively be or comprise monocrystalline silicon/CMOS bulk, silicon-germanium (SiGe), silicon on insulator (SOI), or another suitable semiconductor material. In further embodiments, the first IC structure 134 includes a portion of the semiconductor wafer 104, a first interconnect structure 132, and a bonding structure 130. The first interconnect structure 132 is disposed along a front-side surface 104f of the semiconductor wafer 104 and the bonding structure 130 is disposed along a bottom surface of the first interconnect structure 132. In some embodiments, the bonding structure 130 may, for example, be or comprise an oxide, such as silicon dioxide, a high-density oxide, another dielectric material, or any combination of the foregoing. In further embodiments, the second IC structure 110 includes a portion of the semiconductor wafer 104, a second interconnect structure 136, and an input/output (I/O) structure 220. The second interconnect structure 136 is disposed along a back-side surface 104b of the semiconductor wafer 104 and the I/O structure 220 is disposed along a top surface of the second interconnect structure 136.

In some embodiments, the first and second interconnect structures 132, 136 comprise individual interconnect dielectric structures 202, individual pluralities of conductive vias 204, and individual pluralities of conductive wires 206. In some embodiments, the interconnect dielectric structures 202 may be or comprise one or more inter-level dielectric (ILD) layers and/or one or more inter-metal dielectric (IMD) layers. The pluralities of conductive vias and wires 204, 206 are disposed within the interconnect dielectric structures 202 and are configured to electrically couple one or more semiconductor devices to one another. In some embodiments, the interconnect dielectric structures 202 may, for example, be or comprise low-k dielectric materials, silicon dioxide, other suitable dielectric material(s), or any combination of the foregoing. In yet further embodiments, the pluralities of conductive vias and wires 204, 206 may, for example, respectively be or comprise tungsten, ruthenium, titanium, titanium nitride, tantalum nitride, copper, aluminum, other conductive material(s), or any combination of the foregoing. In yet further embodiments, the first and second interconnect structures 132, 136 may each be or comprise front-end of line (FEOL) devices/layers, middle-end of line (MEOL) devices/layers, and/or back-end of line (BEOL) devices/layers. In yet further embodiments, the handle wafer 102 may be configured as an IC structure, such that a lower interconnect structure (not shown) is disposed along a front-side surface 102f of the handle wafer 102. In such embodiments, a plurality of lower semiconductor devices (not shown) may be disposed within and/or on the handle wafer 102. In addition, in some embodiments, one or more through-substrate vias (TSVs) 218 extend from the first interconnect structure 132, through the semiconductor wafer 104, to the second interconnect structure 136. The TSVs 218 are configured to electrically couple the conductive vias and wires 204, 206 within the first and second interconnect structures 132, 136 to one another.

In further embodiments, the first IC structure 134 and/or the second IC structure 110 may each be configured as a back-side illumination (BSI) complementary metal-oxide-semiconductor (CMOS) image sensor (CIS). In such embodiments, a plurality of photodetectors (not shown) may be disposed within the semiconductor wafer 104. In various embodiments, the first IC structure 134 and/or the second IC structure 110 may each be configured as an application-specific integrated circuit (ASIC) device. Further, the first IC structure 134 and/or the second IC structure 110 may each comprise logic devices (e.g., transistors, diodes, etc.), memory devices (e.g., dynamic random-access memory (DRAM) devices, static random-access memory (SRAM) devices, magnetoresistive random-access memory (MRAM) devices, another suitable memory device, or any combination of the foregoing), another semiconductor device, or any combination of the foregoing.

In some embodiments, the first IC structure 134 comprises a first plurality of FEOL semiconductor devices 208 that are disposed within/on the front-side surface 104f of the semiconductor wafer 104. In an embodiment, the first plurality of FEOL semiconductor devices 208 may be configured as transistors and may each comprise a gate electrode 210, a gate dielectric layer 212, a sidewall spacer structure 216, and a pair of source/drain regions 214. The gate dielectric layer 212 is disposed between the gate electrode 210 and the semiconductor wafer 104. The sidewall spacer structure 216 is disposed along sidewalls of the gate dielectric layer 212 and the gate electrode 210. Further, the pair of source/drain regions 214 may be disposed within the semiconductor wafer 104 on opposing sides of the gate electrode 210. In various embodiments, the first plurality of FEOL semiconductor devices 208 may, for example, each be or comprise a metal oxide semiconductor field effect transistor (MOSFET), a high voltage transistor, a bipolar junction transistor (BJT), an n-channel metal oxide semiconductor (nMOS) transistor, a p-channel metal oxide semiconductor (pMOS) transistor, a gate-all-around FET (GAAFET), a gate-surrounding FET, a multi-bridge channel FET (MBCFET), a nanowire FET, a nanoring FET, a nanosheet field-effect transistor (NSFET), or the like. It will be appreciated that the first plurality of FEOL semiconductor devices 208 each being configured as another semiconductor device is also within the scope of the disclosure. In yet further embodiments, a thickness t1 of the semiconductor wafer 104 may be within a range of about 0.5 to 10 micrometers (um) or another suitable thickness value.

In addition, the I/O structure 220 may, for example, comprise a plurality of upper I/O contacts 226 (e.g., contact pads, solder bumps, etc.) that directly overlie a corresponding upper I/O via 224. The upper I/O contacts 226 and the upper I/O vias 224 are disposed within an upper dielectric structure 222. The upper I/O contacts 226 are directly electrically coupled to conductive vias and wires 204, 206 within the first and second interconnect structures 132, 134. Thus, the upper I/O contacts 226 are electrically coupled to first plurality of FEOL semiconductor devices 208 by way of the interconnect layers (e.g., conductive vias and wires 204, 206). The I/O structure 220 is configured to provide electrical connections to the 3D IC structure. This, in part, may facilitate the 3D IC structure 200a being electrically coupled to another IC (not shown).

In some embodiments, a plurality of lower alignment marks 106 are disposed along the front-side surface 102f of the handle wafer 102, and a plurality of upper alignment marks 108 are disposed along a bottom surface of the bonding structure 130. In some embodiments, the lower and/or upper alignment marks 106, 108 may, for example, each be or comprise a metal material or a dielectric material. The metal material may, for example, be or comprise copper, aluminum, titanium, some other suitable metal(s), or any combination of the foregoing. The dielectric material may, for example, be or comprise silicon dioxide, silicon nitride, silicon oxynitride, some other suitable dielectric(s), or any combination of the foregoing. In various embodiments, during fabrication of the 3D IC structure 200a, the first IC structure 134 is bonded to the handle wafer 102, such that the handle wafer 102 and the bonding structure 130 meet at a bond interface. Further, after the bonding process, the plurality of upper alignment marks 108 and the lower alignment marks 106 may be laterally offset from one another, for example, by an OVL shift that may include a translation distance Td and/or a rotation shift (not shown) (as illustrated and/or described in FIG. 1A). Further, after the bonding process, the second IC structure 110 may be formed over the first IC structure 134. Layers of the second IC structure 110 (e.g., layers of the second interconnect structure 136 and/or layers of the I/O structure 220) may, for example, be formed by utilizing a photolithography tool (not shown). In some embodiments, the photolithography tool is configured to complete one or more photolithography processes according to the measured OVL shift, such that the layers of the second IC structure 110 are aligned with layers of the first IC structure 134. For example, a photomask (not shown) of the photolithography tool may be shifted according to the measured OVL shift, and may be utilized to form the TSVs 218, such that each TSV 218 overlies a corresponding conductive wire 206 within the first interconnect structure 132. This, in part, facilitates proper electrical connections between layers of the first and second IC structures 134, 110, thereby increasing a performance and device yield of the 3D IC structure 200a.

Figure 2B:
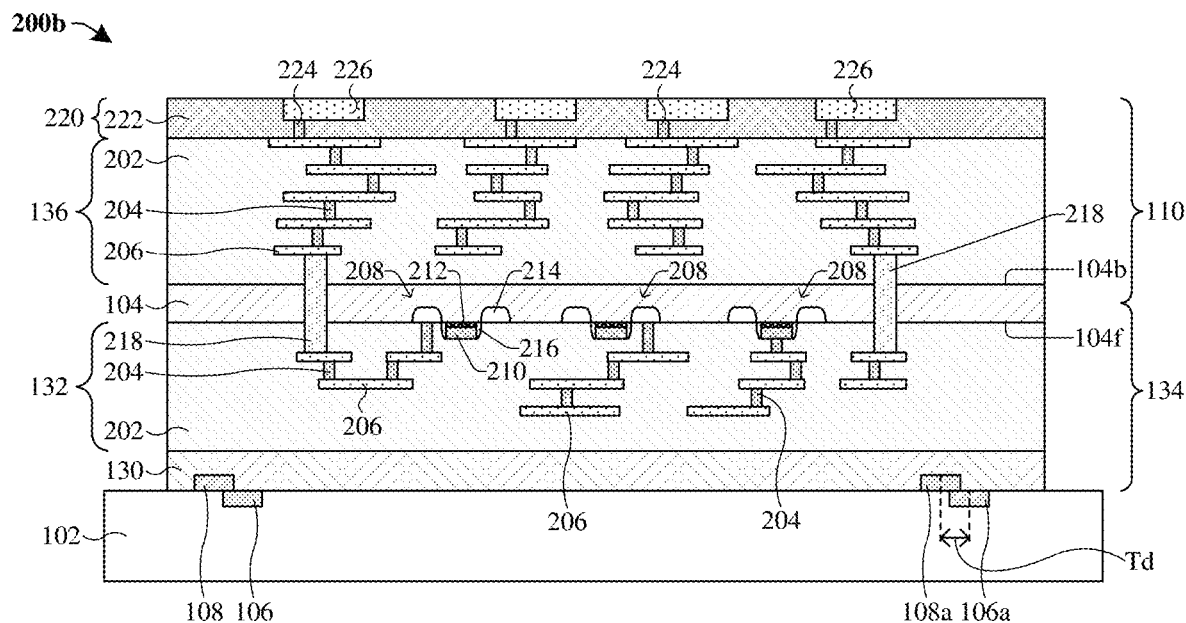

FIG. 2B illustrates a cross-sectional view of some embodiments of a 3D IC structure 200b corresponding to some alternative embodiments of the 3D IC structure 200a of FIG. 2A, in which each upper alignment mark in the plurality of upper alignment marks 108 directly contacts a corresponding lower alignment mark in the plurality of lower alignment marks 106. For example, the plurality of upper alignment marks 108 comprises a first upper alignment mark 108a and the plurality of lower alignment marks 106 comprises a first lower alignment mark 106a. In some embodiments, at least a portion of the first upper alignment mark 108a directly contacts at least a portion of the first lower alignment mark 106a. In various embodiments, a center of the first upper alignment mark 108a is laterally offset from a center of the first lower alignment mark 106a by a translation distance Td. In yet further embodiments, each upper alignment mark in the plurality of upper alignment marks 108 is bonded to a corresponding lower alignment mark in the plurality of lower alignment marks 106.

Figure 2C:
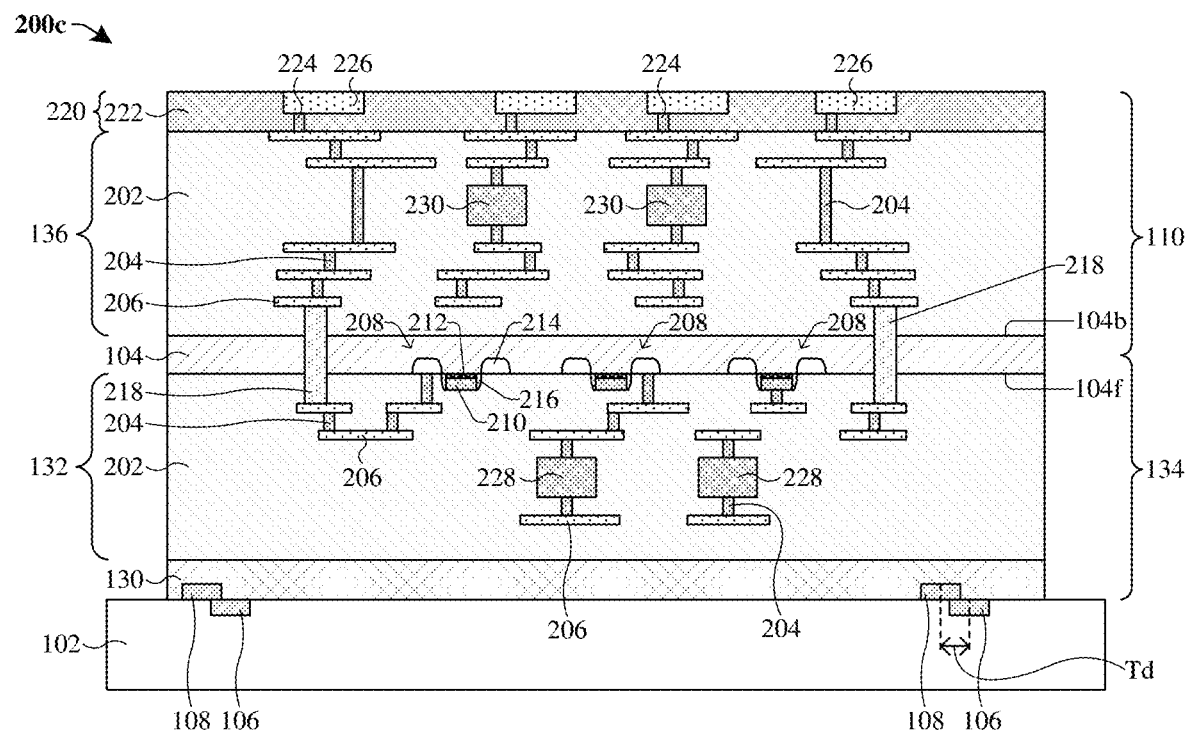

FIG. 2C illustrates a cross-sectional view of some embodiments of a 3D IC structure 200c corresponding to some alternative embodiments of the 3D IC structure 200a of FIG. 2A, in which a first plurality of BEOL semiconductor devices 228 are disposed within the first interconnect structure 132 and a second plurality of BEOL semiconductor devices 230 are disposed within the second interconnect structure 136. In some embodiments, each BEOL semiconductor device in the first and second plurality of BEOL semiconductor devices 228, 230 may, for example, be configured as a DRAM device, an SRAM device, an MRAM device, another suitable memory device, a capacitor, or another semiconductor device. In yet further embodiments, the first and second pluralities of BEOL semiconductor devices 228, 230 are disposed between layers of conductive wires 206 within the first and second interconnect structures 132, 136.

Figure 2D:
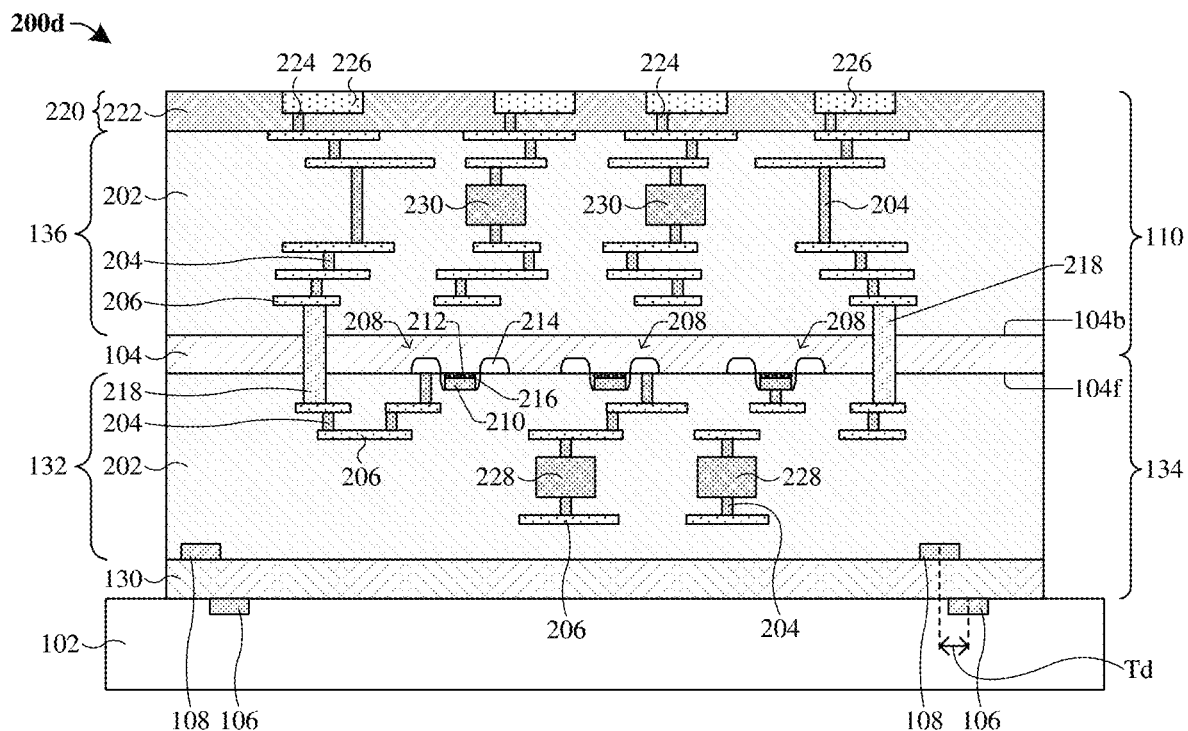

FIG. 2D illustrates a cross-sectional view of some embodiments of a 3D IC structure 200d corresponding to some alternative embodiments of the 3D IC structure 200a of FIG. 2A, in which the plurality of upper alignment marks 108 are disposed within the first interconnect structure 132. In various embodiments, the plurality of upper alignment marks 108 may be disposed along a bottom surface of the interconnect dielectric structure 202 of the first interconnect structure 132.

Figure 2E:
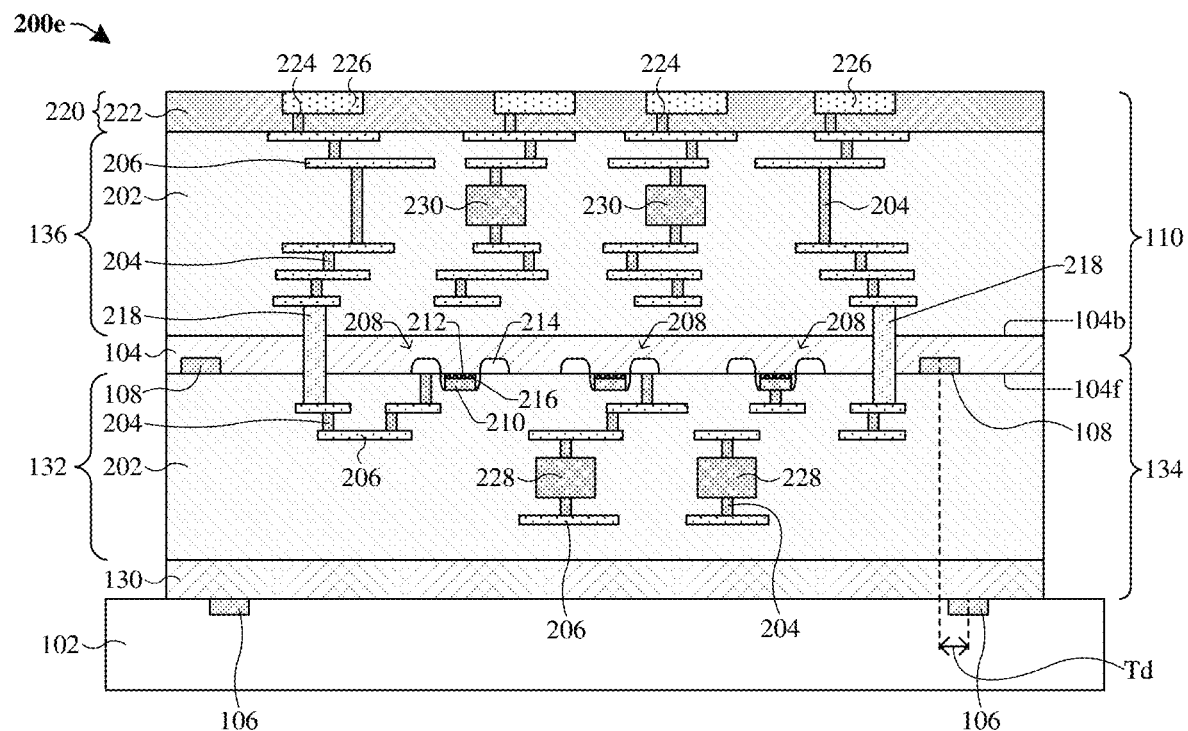

FIG. 2E illustrates a cross-sectional view of some embodiments of a 3D IC structure 200e corresponding to some alternative embodiments of the 3D IC structure 200a of FIG. 2A, in which the plurality of upper alignment marks 108 are disposed along a front-side surface 104f of the semiconductor wafer 104. In various embodiments, a bottom surface of the plurality of upper alignment marks 108 are aligned with the front-side surface 104f of the semiconductor wafer 104.

Figure 2F:
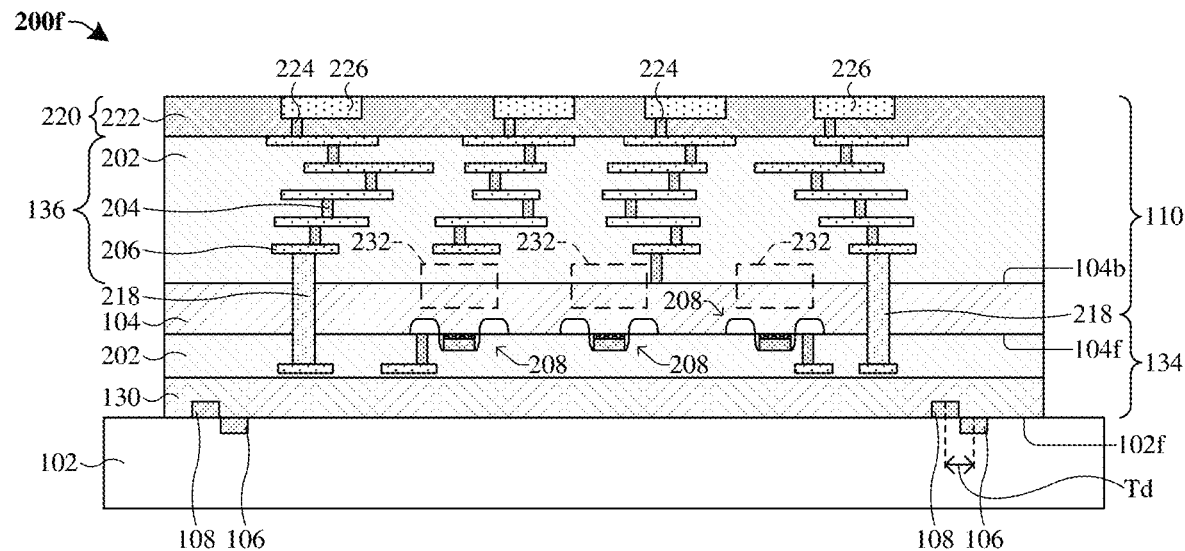

FIG. 2F illustrates a cross-sectional view of some embodiments of a 3D IC structure 200f corresponding to some alternative embodiments of the 3D IC structure 200a of FIG. 2A, in which the second IC structure 110 comprises a second plurality of FEOL semiconductor devices 232 that are disposed within/on a back-side surface 104b of the semiconductor wafer 104. In various embodiments, the second plurality of FEOL semiconductor devices 232 may, for example, each be configured as a transistor, or another suitable semiconductor device.

Figure 2G:
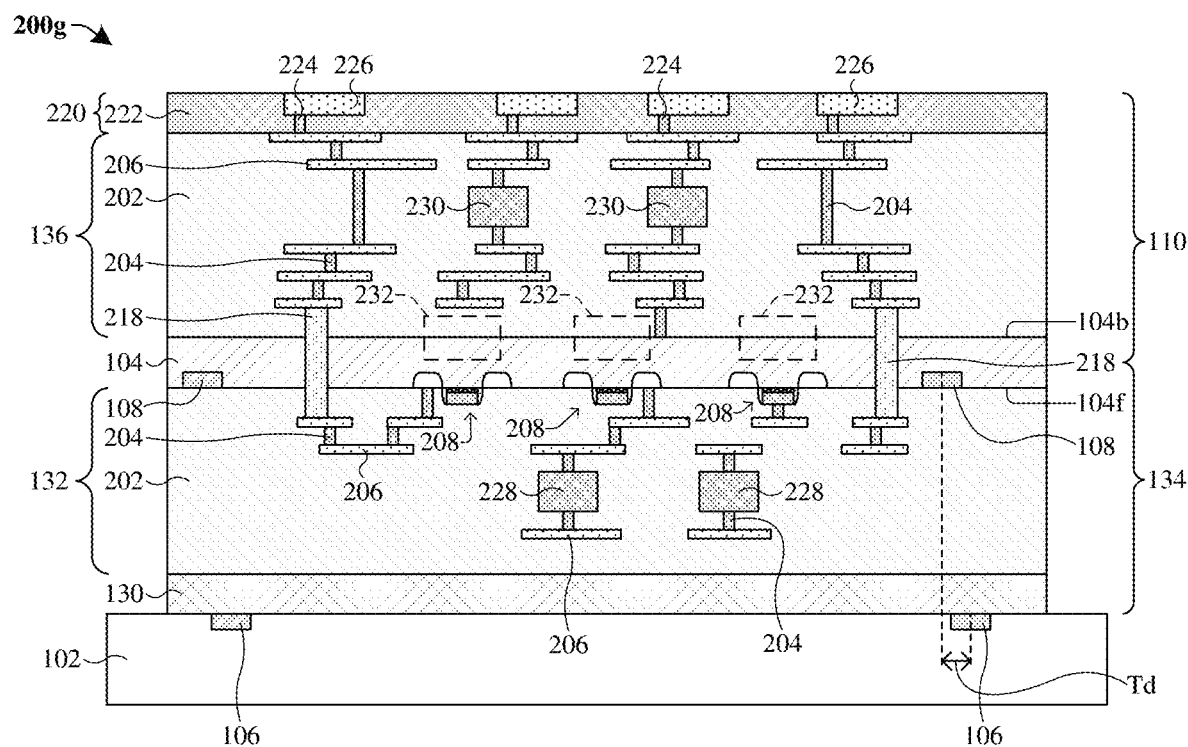

FIG. 2G illustrates a cross-sectional view of some embodiments of a 3D IC structure 200g corresponding to some alternative embodiments of the 3D IC structure 200a of FIG. 2A, in which the second plurality of FEOL semiconductor devices 232 are disposed vertically between the first plurality of FEOL semiconductor devices 208 and the second plurality of BEOL semiconductor devices 230.

Figure 2H:
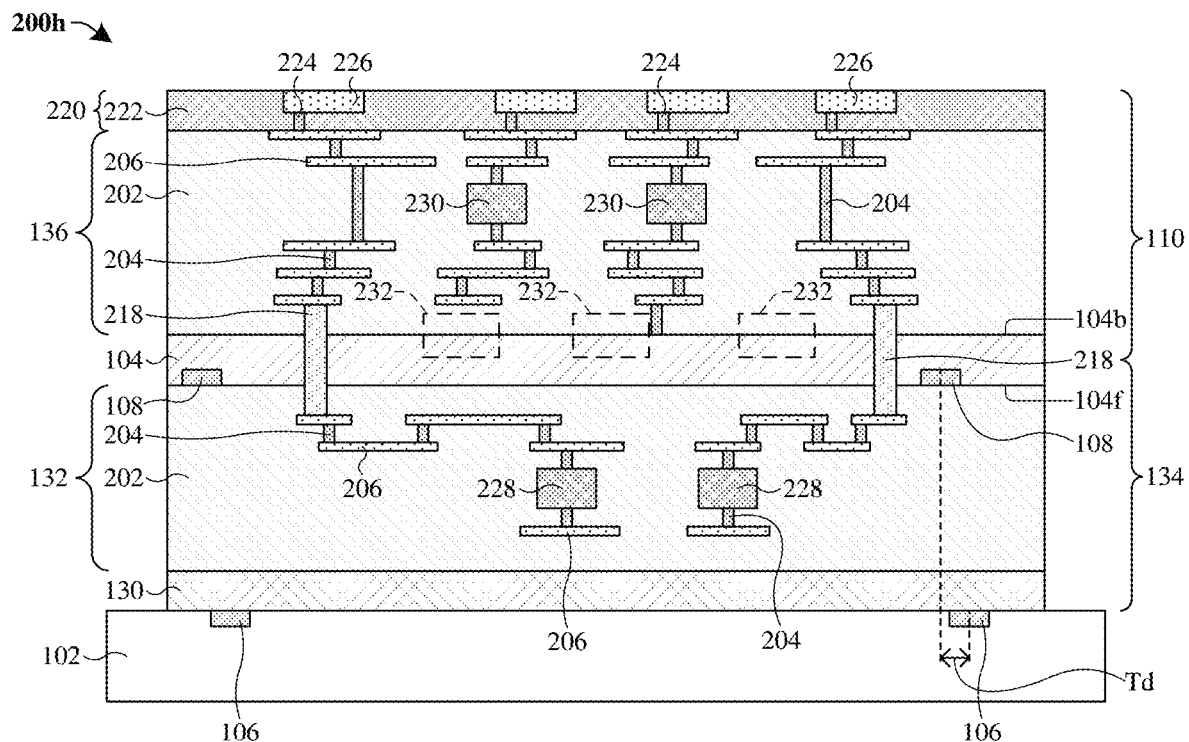

FIG. 2H illustrates a cross-sectional view of some embodiments of a 3D IC structure 200h corresponding to some alternative embodiments of the 3D IC structure 200a of FIG. 2A, in which the first plurality of FEOL semiconductor devices (208 of FIG. 2A) are omitted. In such embodiments, the second IC structure 110 comprises the second plurality of FEOL semiconductor devices 232 and the second plurality of BEOL semiconductor devices 230, and the first IC structure 134 comprises the first plurality of BEOL semiconductor devices 228.

Figure 2I:
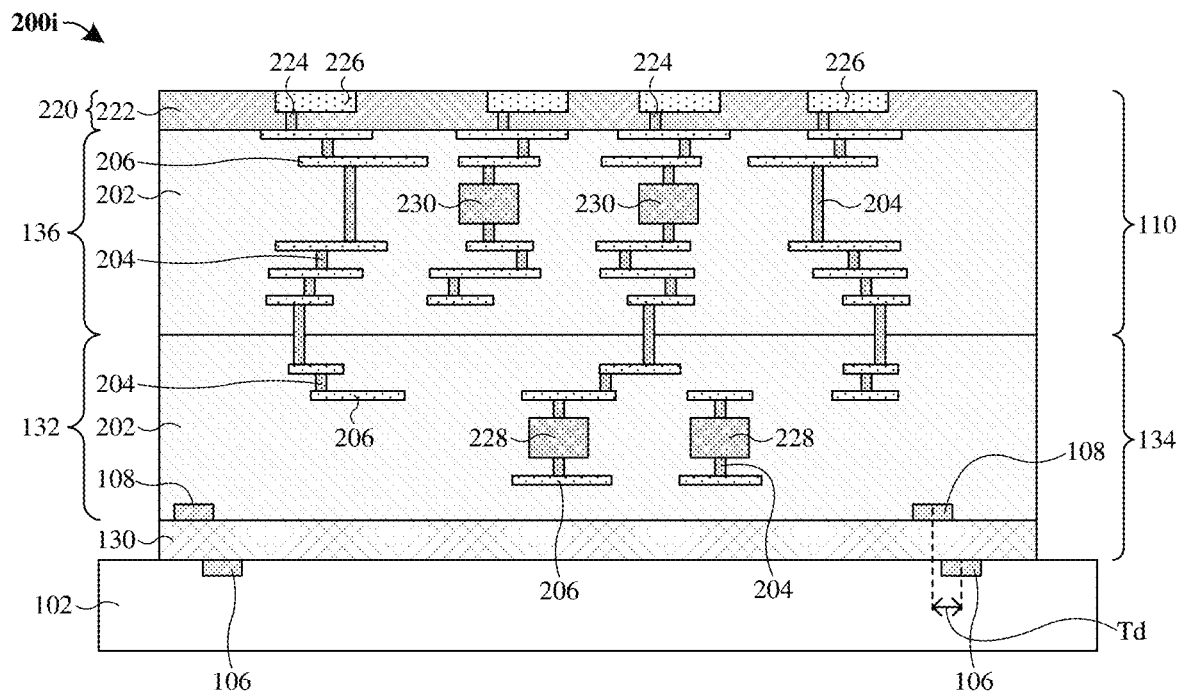

FIG. 2I illustrates a cross-sectional view of some embodiments of a 3D IC structure 200i corresponding to some alternative embodiments of the 3D IC structure 200a of FIG. 2A, in which the semiconductor wafer (104 of FIG. 2A) is omitted. In such embodiments, the semiconductor wafer (104 of FIG. 2A) may be completely removed by a thinning process.

Figure 2J:
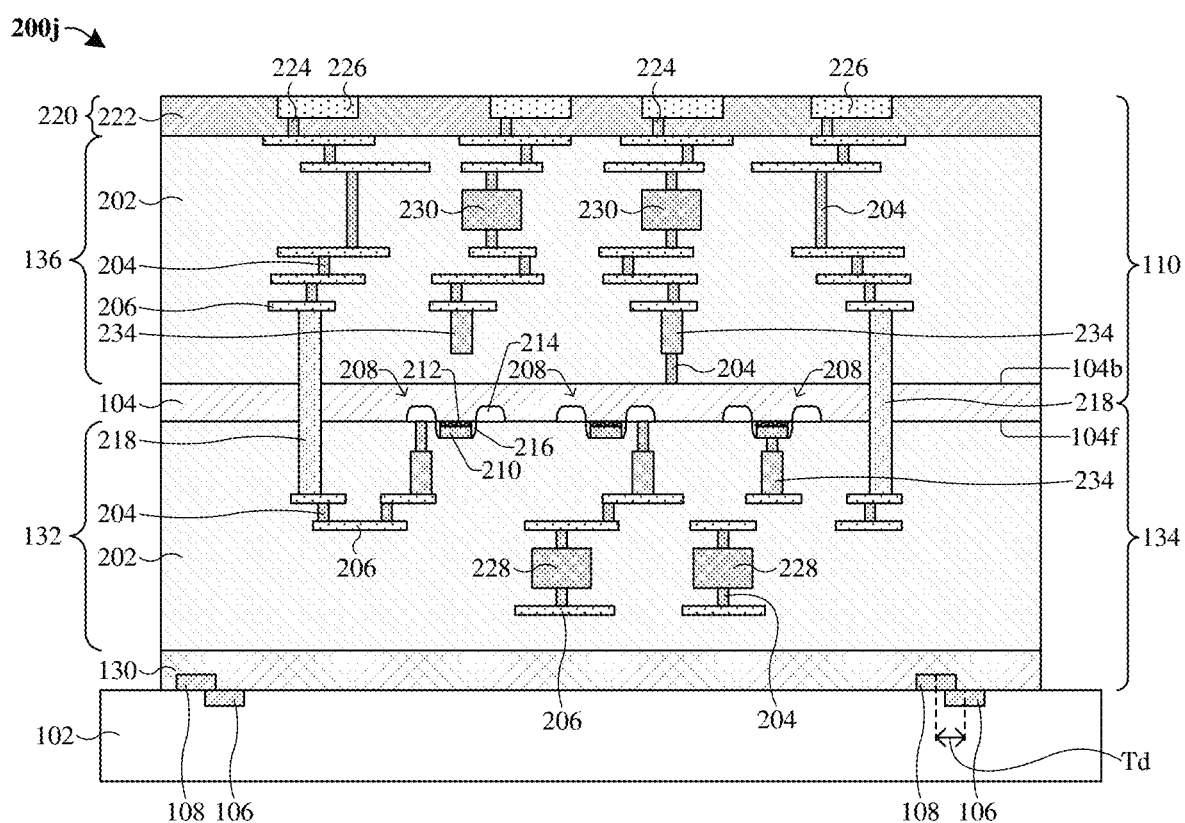

FIG. 2J illustrates a cross-sectional view of some embodiments of a 3D IC structure 200j corresponding to some alternative embodiments of the 3D IC structure 200a of FIG. 2A, in which the first and second interconnect structures 132, 136 respectively comprise middle-of-the-line (MOL) structures 234. In some embodiments, the MOL structures 234 may, for example, each be or comprise copper, cobalt, tungsten, aluminum, another suitable conductive material, or any combination of the foregoing.

Figure 2K:
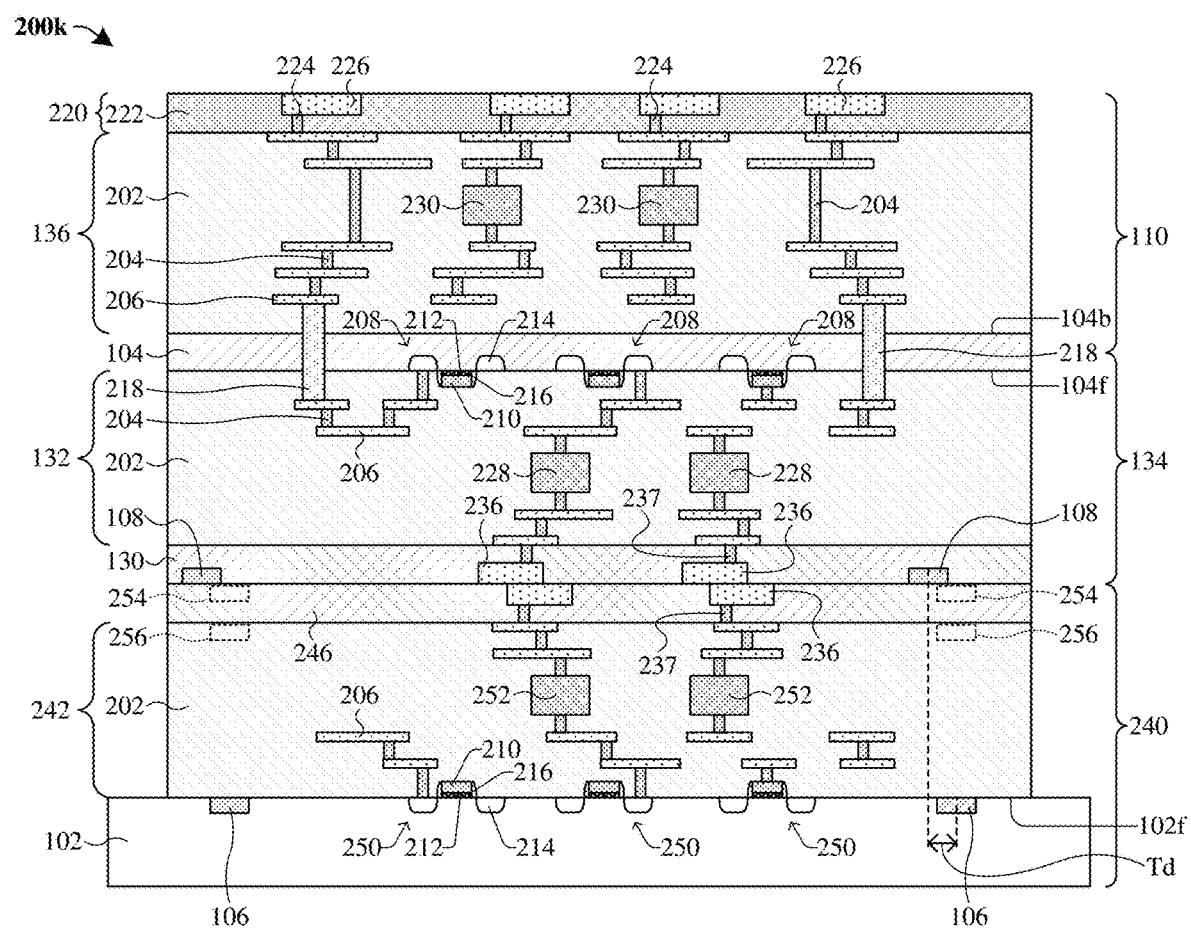

FIG. 2K illustrates a cross-sectional view of some embodiments of a 3D IC structure 200k corresponding to some alternative embodiments of the 3D IC structure 200a of FIG. 2A, in which a third IC structure 240 is disposed beneath the first IC structure 134. In some embodiments, the third IC structure 240 comprises the handle wafer 102, a third interconnect structure 242 disposed along a front-side surface 102f of the handle wafer 102, and a lower bonding structure 246. In further embodiments, the third IC structure 240 comprises a third plurality of FEOL semiconductor devices 250 disposed within/on the front-side surface 102f of the handle wafer 102, and a third plurality of BEOL semiconductor devices 252 disposed within the third interconnect structure 242.

In various embodiments, the third plurality of FEOL semiconductor devices 250 may, for example, each be configured as a transistor, or another suitable semiconductor device. In some embodiments, the third plurality of BEOL semiconductor devices 252 may, for example, each be configured as a DRAM device, an SRAM device, an MRAM device, another suitable memory device, a capacitor, or another semiconductor device. In yet further embodiments, the third plurality of BEOL semiconductor devices 252 are disposed between layers of conductive wires 206 within the third interconnect structure 242. In further embodiments, the third IC structure 240 may be configured as a back-side illumination (BSI) CIS. In such embodiments, a plurality of photodetectors (not shown) may be disposed within the handle wafer 102. In various embodiments, the third IC structure 240 may be configured as an ASIC device. Further, the third IC structure 240 may comprise logic devices (e.g., transistors, diodes, etc.), memory devices (e.g., DRAM devices, SRAM devices, MRAM devices, another suitable memory device, or any combination of the foregoing), another semiconductor device, or any combination of the foregoing. In yet further embodiments, the bonding structure 130 and the lower bonding structure 246 may each comprise bond pads 236 and bonding vias 237. In various embodiments, the bond pads 236 and the bonding vias 237 are configured to electrically couple the first IC structure 134 to the third IC structure 240.

In some embodiments, the plurality of lower alignment marks 106 may be disposed along an upper surface of the interconnect dielectric structure 202 of the third interconnect structure 242, as illustrated by the dashed boxes 256. In yet further embodiments, the plurality of lower alignment marks 106 may be disposed along an upper surface of the lower bonding structure 246, as illustrated by the dashed boxes 254.

Figure 3A:
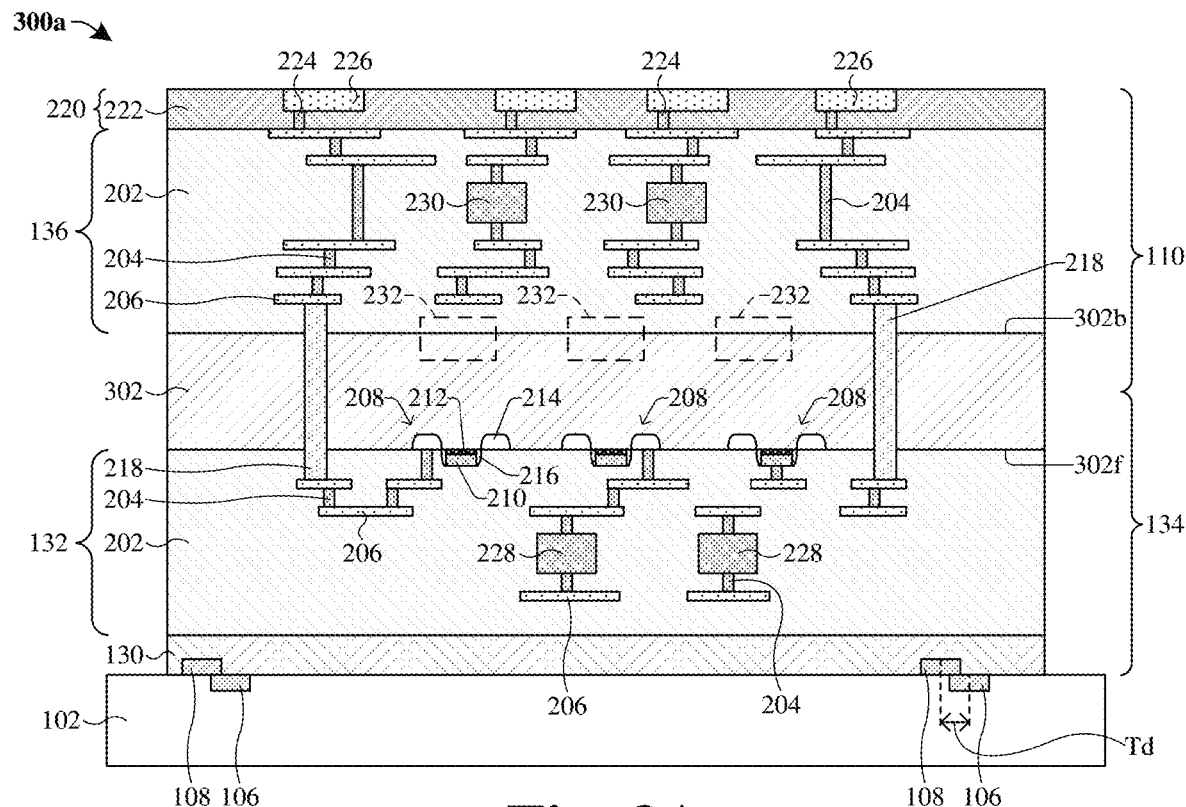

FIG. 3A illustrates a cross-sectional view of some embodiments of a 3D IC structure 300a comprising a second IC structure 110 overlying a first IC structure 134. In some embodiments, the first IC structure 134 comprises a portion of the semiconductor substrate 302, a first interconnect structure 132 disposed along a front-side surface 302f of the semiconductor substrate 302, and a bonding structure 130 disposed between the first interconnect structure 132 and the handle wafer 102. In further embodiments, the second IC structure 110 comprises a portion of the semiconductor substrate 302, a second interconnect structure 136 disposed along a back-side surface 302b of the semiconductor substrate 302, and an I/O structure 220 disposed along the second interconnect structure 136. In some embodiments, the semiconductor substrate 302 comprises any type of semiconductor body (e.g., monocrystalline silicon/CMOS bulk, silicon-germanium (SiGe), silicon-on-insulator (SOI), etc.). In yet further embodiments, the second IC structure 110 comprises the second plurality of FEOL semiconductor devices 232 that are disposed within/on a back-side surface 302b of the semiconductor substrate 302. In various embodiments, the second plurality of FEOL semiconductor devices 232 may, for example, each be configured as a transistor, or another suitable semiconductor device.

Figure 3B:
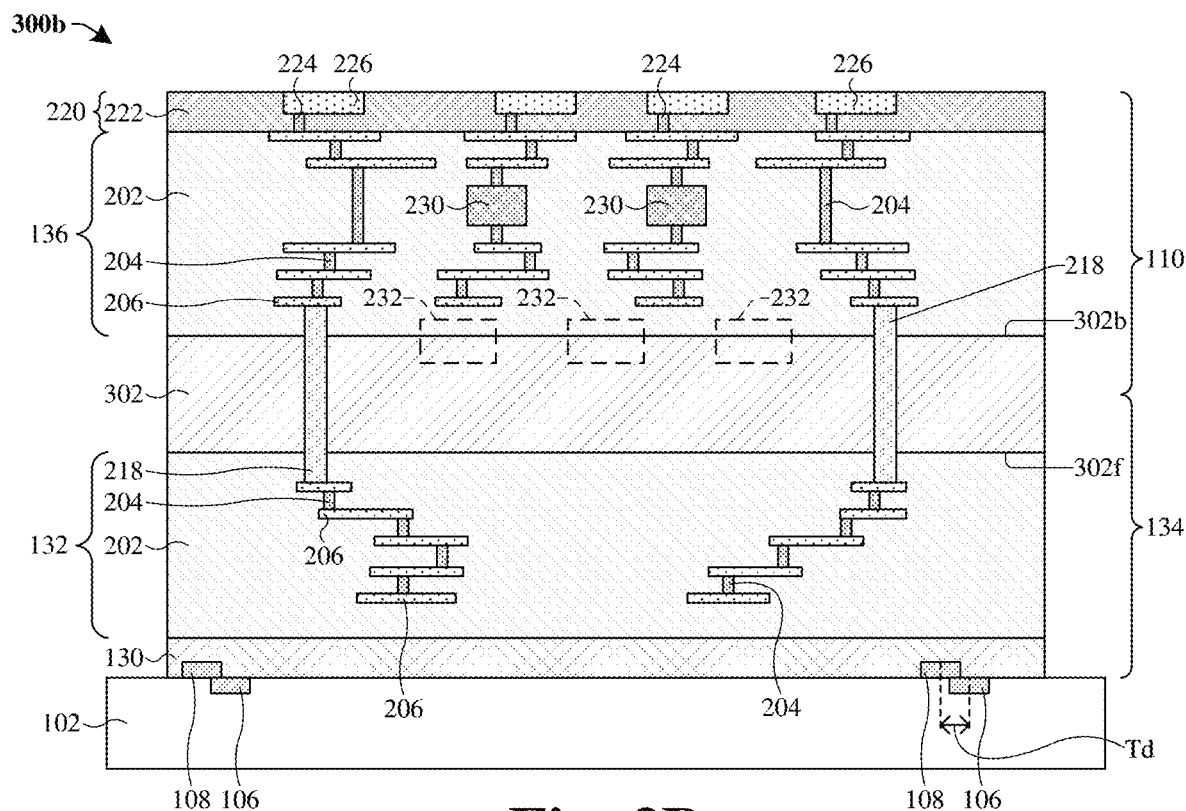

FIG. 3B illustrates a cross-sectional view of some embodiments of a 3D IC structure 300b corresponding to some alternative embodiments of the 3D IC structure 300a of FIG. 3A, in which the first plurality of FEOL semiconductor devices (208 of FIG. 3A) and the first plurality of BEOL semiconductor devices (228 of FIG. 3A) are omitted.

FIGS. 4A-4F illustrate multiple layout views 400a-f corresponding to various embodiments of an individual alignment mark 401. The layout views 400a-f may, for example, each be representative of a layout of each alignment mark in the plurality of lower alignment marks (106 of FIGS. 2A-2E) and the plurality of upper alignment marks (108 of FIGS. 2A-2E). In various embodiments, each alignment mark in the plurality of lower alignment marks (106 of FIGS. 2A-2E) and the plurality of upper alignment marks (108 of FIGS. 2A-2E) may have a symmetric layout or may have a non-symmetric layout.

Figure 4A:
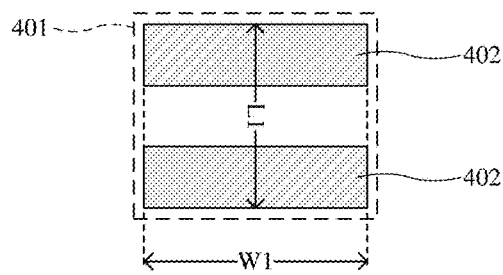
FIGS. 4A-4F illustrate various embodiments of layout views of an individual alignment mark.
Figure 4B:
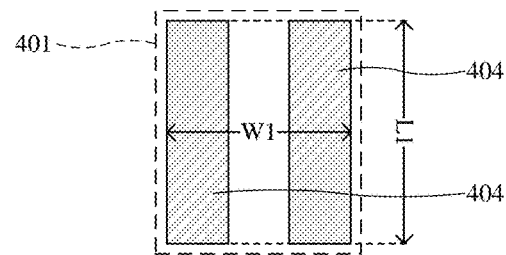
Figure 4C:
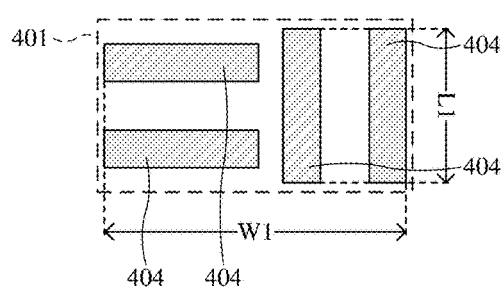
Figure 4D:
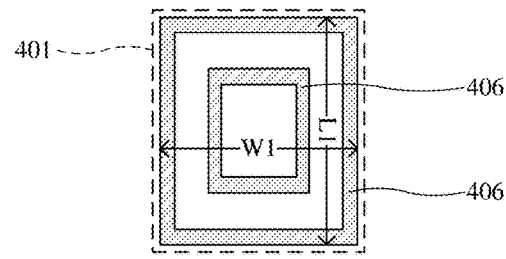
Figure 4E:
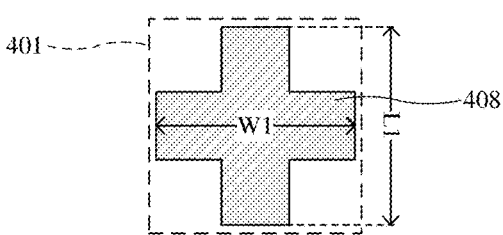
Figure 4F:
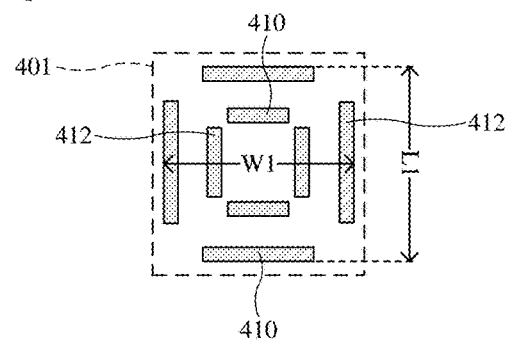

With reference to the layout view 400a of FIG. 4A, the alignment mark 401 comprises a first pair of line-shaped marks 402 that are arranged in parallel with one another. In some embodiments, a length L1 of the alignment mark 401 may, for example, be within a range of about 40 to 200 micrometers (um) or another suitable value. In yet further embodiments, a width W1 of the alignment mark 401 may, for example, be within a range of about 40 to 200 um or another suitable value. With reference to the layout view 400b of FIG. 4B, the alignment mark 401 comprises a second pair of line-shaped marks 404 that are arranged in parallel with one another. With reference to the layout view 400c of FIG. 4C, the alignment mark 401 comprises a first pair of line-shaped marks 402 that are arranged in parallel with one another and a second pair of line-shaped marks 404 that are arranged in parallel with one another. In some embodiments, the line-shaped marks 402 of the first pair are elongated continuously in a first direction and the line-shaped marks 404 of the second pair are elongated continuously in a second direction that is orthogonal to the first direction. With reference to the layout view 400d of FIG. 4D, the alignment mark 401 comprises a pair of ring-shaped marks 406 that may, for example, each be concentric with respect to one another. With reference to the layout view 400e of FIG. 4E, the alignment mark 401 comprises a cross-shaped mark 408. With reference to the layout view 400f of FIG. 4F, the alignment mark 401 comprises a plurality of first line-shaped marks 410 elongated in a first direction and a plurality of second line-shaped marks 412 elongated in a second direction orthogonal to the first direction. In some embodiments, a layout of the first line-shaped marks 410 and the second line-shaped marks 412 is symmetric about a center point of the alignment mark 401.

FIGS. 5-7, 8A and 8B through 11A and 11B, 12A-12D, and 13-17 illustrate various views of some embodiments of a method for bonding a first IC structure to a handle wafer, and forming a second IC structure over the first IC structure based on an OVL shift measured between the handle wafer and the first IC structure according to the present disclosure. Although the various views shown in FIGS. 5-7, 8A and 8B through 11A and 11B, 12A-12D, and 13-17 are described with reference to a method, it will be appreciated that the structures shown in FIGS. 5-7, 8A and 8B through 11A and 11B, 12A-12D, and 13-17 are not limited to the method but rather may stand alone separate of the method. Furthermore, although FIGS. 5-7, 8A and 8B through 11A and 11B, 12A-12D, and 13-17 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 5:
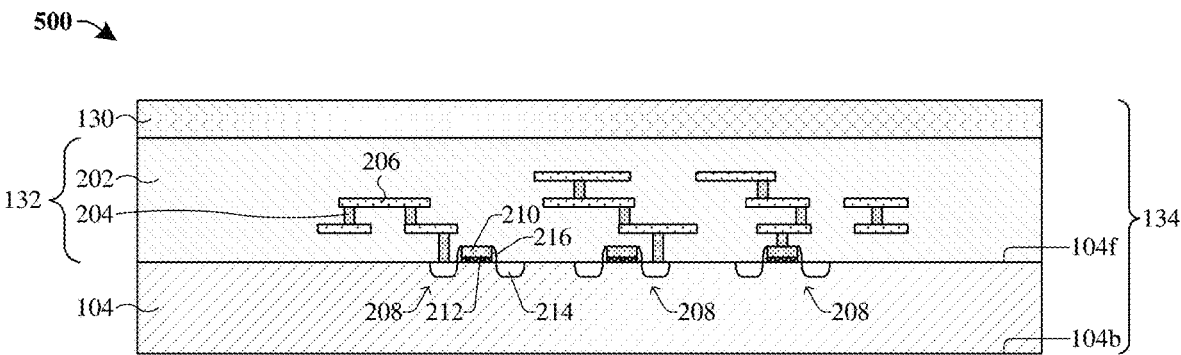

As shown in the cross-sectional view 500 of FIG. 5, a semiconductor wafer 104 is provided. In some embodiments, the semiconductor wafer 104 comprises any type of semiconductor body (e.g., monocrystalline silicon/CMOS bulk, silicon-germanium (SiGe), silicon on insulator (SOI), etc.). Further, as shown in FIG. 5, a plurality of FEOL semiconductor devices 208, a first interconnect structure 132, and a bonding structure 130 are formed over/on the semiconductor wafer 104, thereby forming a first IC structure 134. In some embodiments, the first IC structure 134 comprises the semiconductor wafer 104, the first interconnect structure 132, the plurality of FEOL semiconductor devices 208, and the bonding structure 130. In further embodiments, a process for forming the bonding structure 130 may comprise depositing the bonding structure 130 on the interconnect dielectric structure 202 of the first interconnect structure 132. In various embodiments, the bonding structure 130 may be deposited by chemical vapor deposition (CVD), high-density plasma (HDP) chemical vapor deposition (HDP-CVD), physical vapor deposition (PVD), atomic layer deposition (ALD), some other deposition or growth process, or any combination of the foregoing. In further embodiments, a planarization process (e.g., a chemical mechanical polishing (CMP) process) may be performed on the bonding structure 130 to planarize an upper surface of the bonding structure 130.

Figure 6:
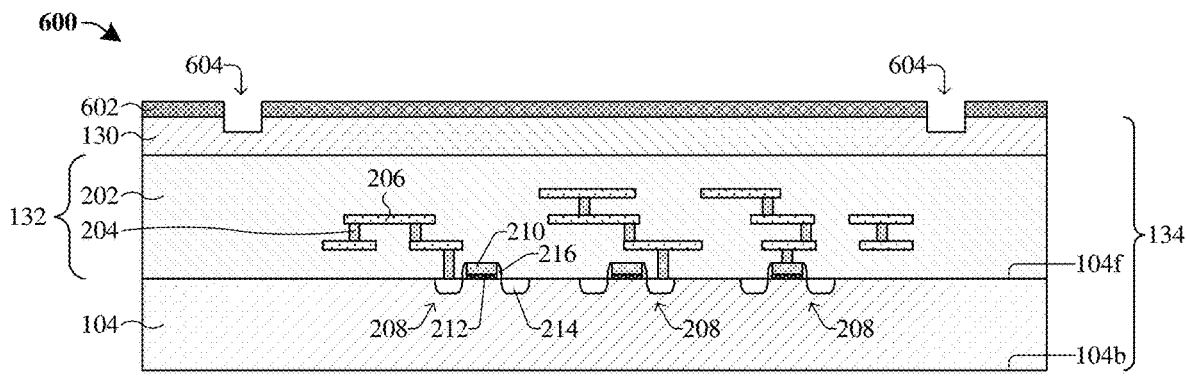

As shown in the cross-sectional view 600 of FIG. 6, a patterning process is performed on the bonding structure 130, thereby forming a plurality of openings 604 within the bonding structure 130. In some embodiments, the patterning process includes: forming a patterned masking layer 602 (e.g., positive/negative photoresist, hardmask, etc.) over the bonding structure 130; performing an etching process on the bonding structure 130 according to the patterned masking layer 602, thereby forming the openings 604; and performing a removal process (not shown) to remove the patterned masking layer 602. In further embodiments, the patterned masking layer 602 may be formed by forming a masking layer (not shown) over the bonding structure 130; performing a photolithography process to expose the masking layer to a pattern (e.g., via a photolithography tool); and developing the masking layer to form the patterned masking layer 602. In some embodiments, the etching process may be a dry etching process, a wet etching process, a reactive ion etching (RIE) process, some other etching process, or any combination of the foregoing.

Figure 7:
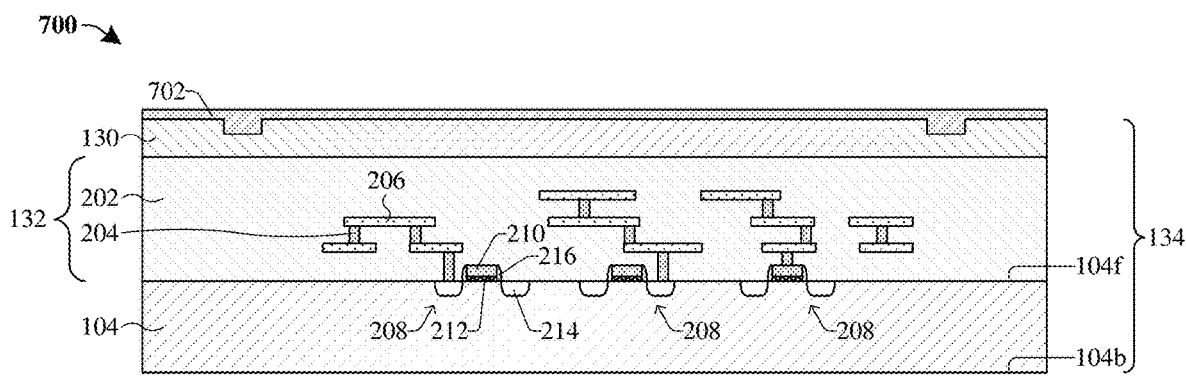

As shown in the cross-sectional view 700 of FIG. 7, alignment mark material 702 is formed over the bonding structure 130 and fills the openings (e.g., 604 of FIG. 6). In some embodiments, a process for forming the alignment mark material 702 may comprise depositing the alignment mark material 702 within the plurality of openings (e.g., 604 of FIG. 6) and on the bonding structure 130. In various embodiments, the alignment mark material 702 may be deposited by CVD, PVD, ALD, sputtering, electroplating, sputtering, electroless plating, or another suitable deposition or growth process. In yet further embodiments, the alignment mark material 702 may, for example, be or comprise a metal material or a dielectric material. The metal material may, for example, be or comprise copper, aluminum, titanium, some other suitable metal(s), or any combination of the foregoing. The dielectric material may, for example, be or comprise silicon dioxide, silicon nitride, silicon oxynitride, some other suitable dielectric(s), or any combination of the foregoing.

Figure 8A:
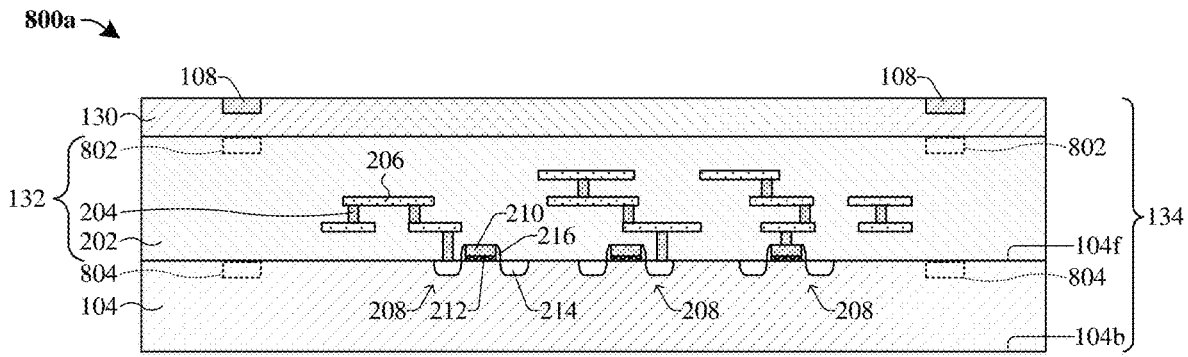
Figure 8B:
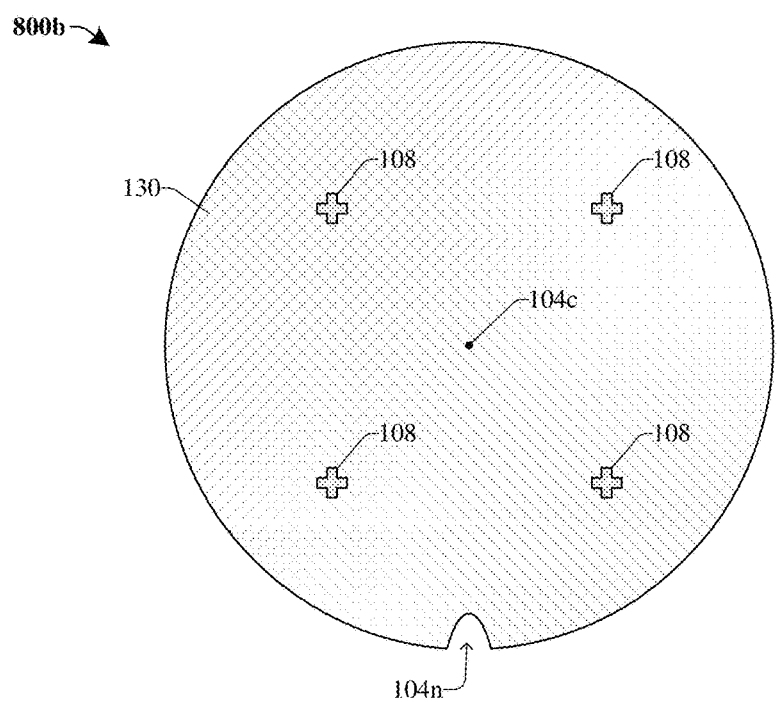

As shown in the cross-sectional view 800a and the top view 800b respectively of FIGS. 8A and 8B, a planarization process is performed on the alignment mark material (702 of FIG. 7), thereby defining a plurality of upper alignment marks 108. In some embodiments, the planarization process co-planarizes an upper surface of the bonding structure 130 and an upper surface of the plurality of upper alignment marks 108. In further embodiments, the planarization process may include performing a CMP process or another suitable planarization process. In some embodiments, it will be appreciated that a process for forming the plurality of upper alignment marks 108 may include the processing steps of FIGS. 6, 7, 8A, and 8B.

FIG. 8B illustrates the top view 800b corresponding to some embodiments of the cross-sectional view 800a of FIG. 8A. In various embodiments, when viewed from above, each upper alignment mark in the plurality of upper alignment marks 108 may have a cross-shape. It will be appreciated that the upper alignment marks 108 having another shape is within the scope of the disclosure. For example, when viewed from above, the upper alignment marks 108 may each have a shape as illustrated and/or described in any of FIGS. 4A-4F. In further embodiments, a circumferential edge of the semiconductor wafer 104 is circular but for the presence of a notch 104n. In yet further embodiments, each upper alignment mark within the plurality of upper alignment marks 108 is equidistant from a center 104c of the semiconductor wafer 104.

In yet further embodiments, the plurality of upper alignment marks 108 may be formed along an upper surface of the interconnect dielectric structure 202 of the first interconnect structure 132, as illustrated by the dashed boxes 802 (e.g., see FIG. 2D). In yet further embodiments, the plurality of upper alignment marks 108 may be formed along the front-side surface 104f of the semiconductor wafer 104, as illustrated by the dashed boxes 804 (e.g., see FIG. 2E).

Figure 9A:
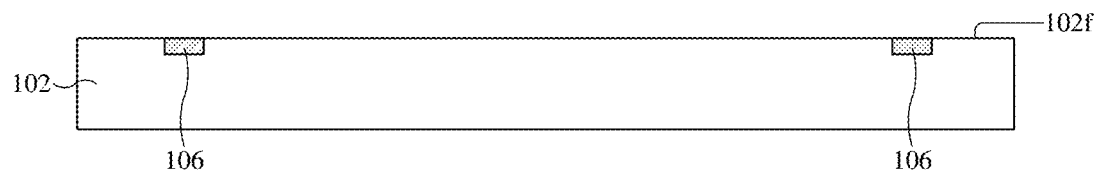
Figure 9B:
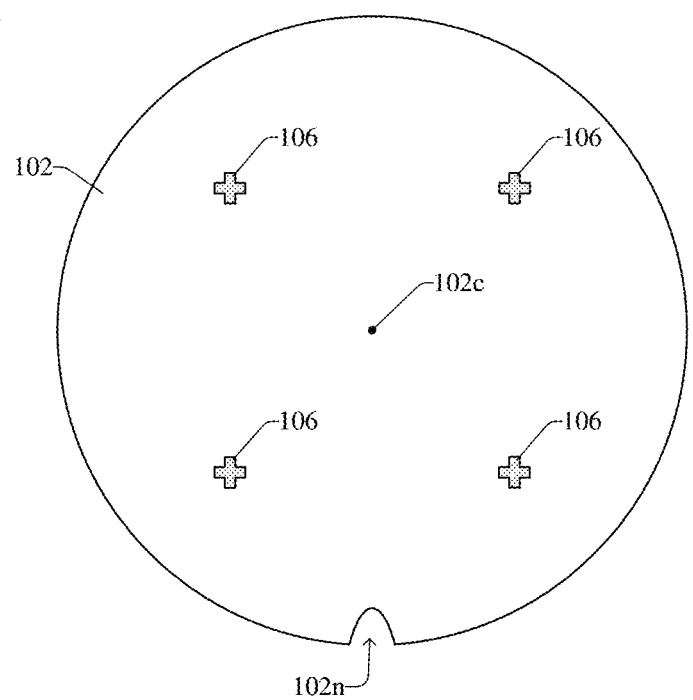

As shown in the cross-sectional view 900a and the top view 900b respectively of FIGS. 9A and 9B, a plurality of lower alignment marks 106 are formed within a handle wafer 102. In some embodiments, a process for forming the plurality of lower alignment marks 106 may include: patterning a front-side surface 102f of the handle wafer 102 to form a plurality of openings (not shown) within the handle wafer 102; depositing an alignment mark material (not shown) on the handle wafer 102 and within the plurality of openings; and performing a planarization process on the alignment mark material to define the plurality of lower alignment marks 106. In various embodiments, the planarization process co-planarizes the front-side surface 102f of the handle wafer 102 and an upper surface of the plurality of lower alignment marks 106. In yet further embodiments, the plurality of lower alignment marks 106 may be formed within the handle wafer 102 by process(es) the same as, or substantially similar to, process(es) described above regarding formation of the plurality of upper alignment marks (108 of FIGS. 8A and 8B) (see, e.g., FIGS. 6, 7, 8A, and 8B).

FIG. 9B illustrates the top view 900b corresponding to some embodiments of the cross-sectional view 900a of FIG. 9A. In various embodiments, when viewed from above, each lower alignment mark in the plurality of lower alignment marks 106 may have a cross-shape. It will be appreciated that the lower alignment marks 106 having another shape is within the scope of the disclosure. For example, when viewed from above, the lower alignment marks 106 may each have a shape as illustrated and/or described in FIGS. 4A-4F. In further embodiments, a circumferential edge of the handle wafer 102 is circular but for the presence of a notch 102n. In yet further embodiments, each lower alignment mark within the plurality of lower alignment marks 106 is equidistant from a center 102c of the handle wafer 102.

Figure 10A:
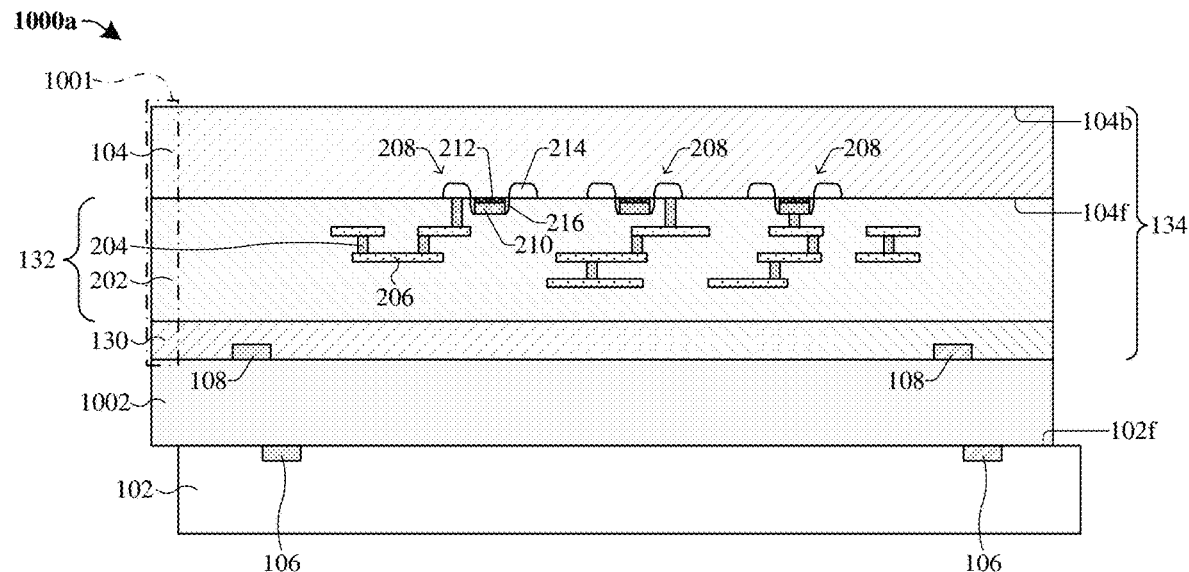
Figure 10B:
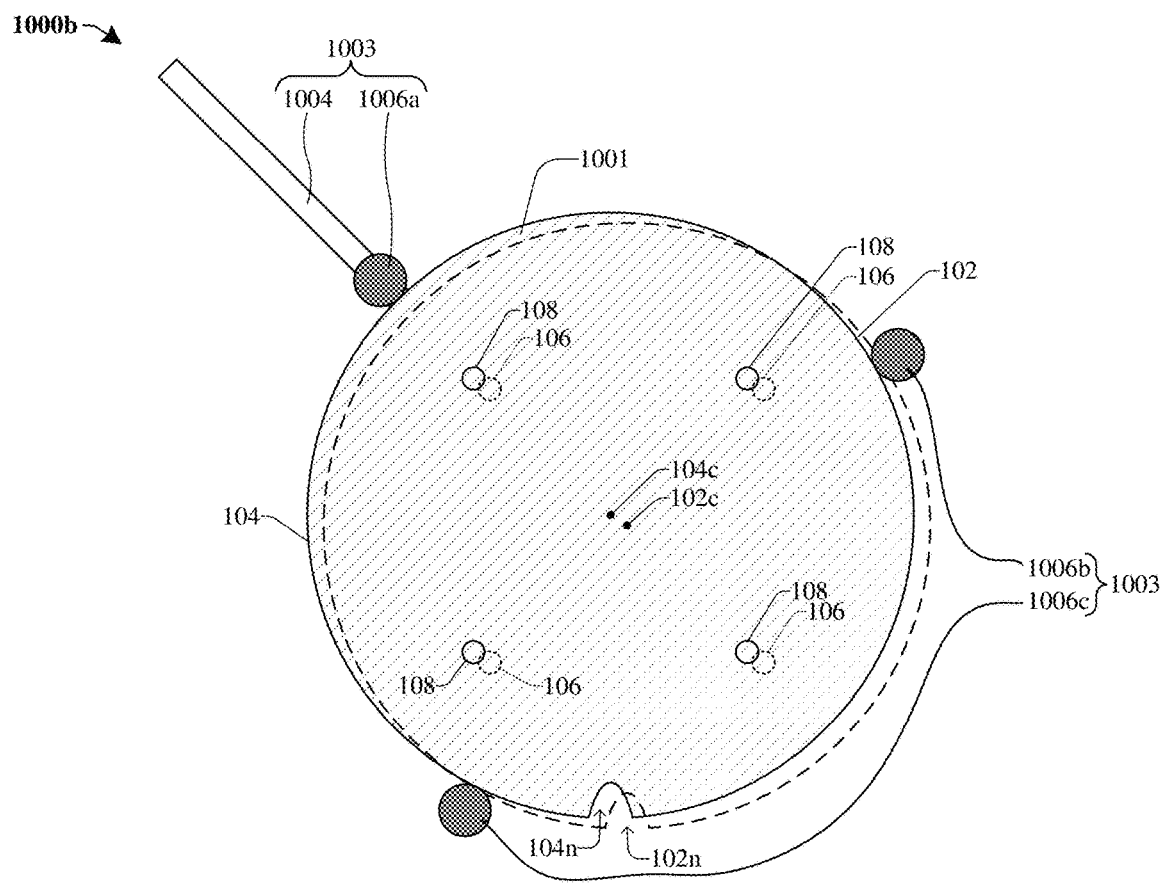

As shown in the cross-sectional view 1000a and the top view 1000b respectively of FIGS. 10A and 10B, the first IC structure 134 is flipped and disposed over the handle wafer 102. In some embodiments, the handle wafer 102 and the first IC structure 134 are disposed within a wafer transport apparatus 1003 that may be part of a bonding apparatus (e.g., 114 of FIG. 1A). In further embodiments, before disposing the first IC structure 134 within the transport apparatus 1003, a spacer structure 1002 is disposed over the handle wafer 102 such that the spacer structure 1002 is spaced vertically between the handle wafer 102 and the first IC structure 134.

FIG. 10B illustrates the top view 1000b corresponding to some embodiments of the cross-sectional view 1000a of FIG. 10A. In various embodiments, the transport apparatus 1003 comprises a plurality of wafer pins 1006a-c and one or more track(s) 1004. The plurality of wafer pins 1006a-c include a first wafer pin 1006a, a second wafer pin 1006b, and a third wafer pin 1006c. In some embodiments, the first wafer pin 1006a is configured to traverse the track 1004 and is configured to guide the semiconductor wafer 104 over the handle wafer 102. In various embodiments, the second and third wafer pins 1006b-c are configured to remain stationary. In yet further embodiments, the second and third wafer pins 1006b-c may be configured to move along one or more track(s) (not shown) to assist in guiding the semiconductor wafer 104 over the handle wafer 102. Thus, in some embodiments, the transport apparatus 1003 is configured to mechanically-align the semiconductor wafer 104 over the handle wafer 102. In some embodiments, after performing the mechanical-alignment, at least an outer region 1001 of the first IC structure 134 is laterally offset from the circumferential edge of the handle wafer 102 in a direction away from the center 102c of the handle wafer 102.

Figure 11A:
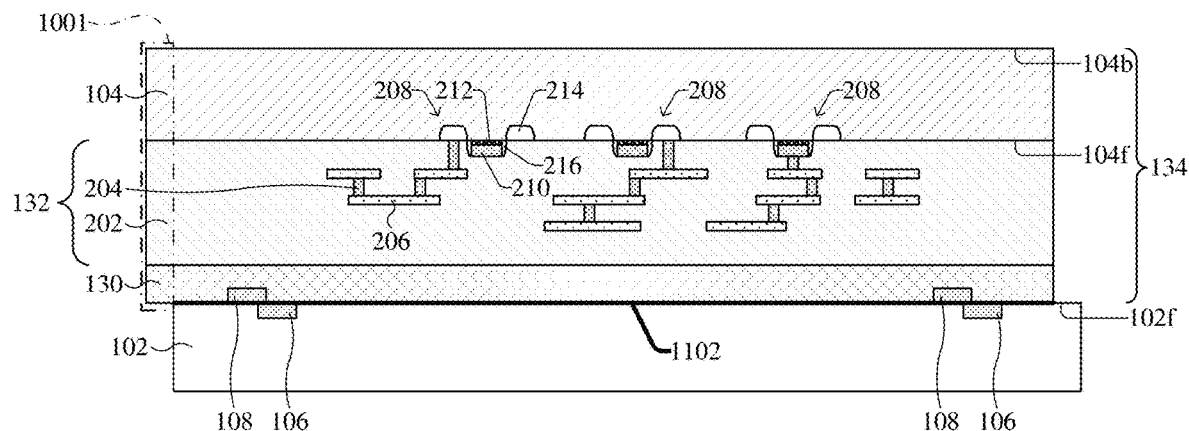
Figure 11B:
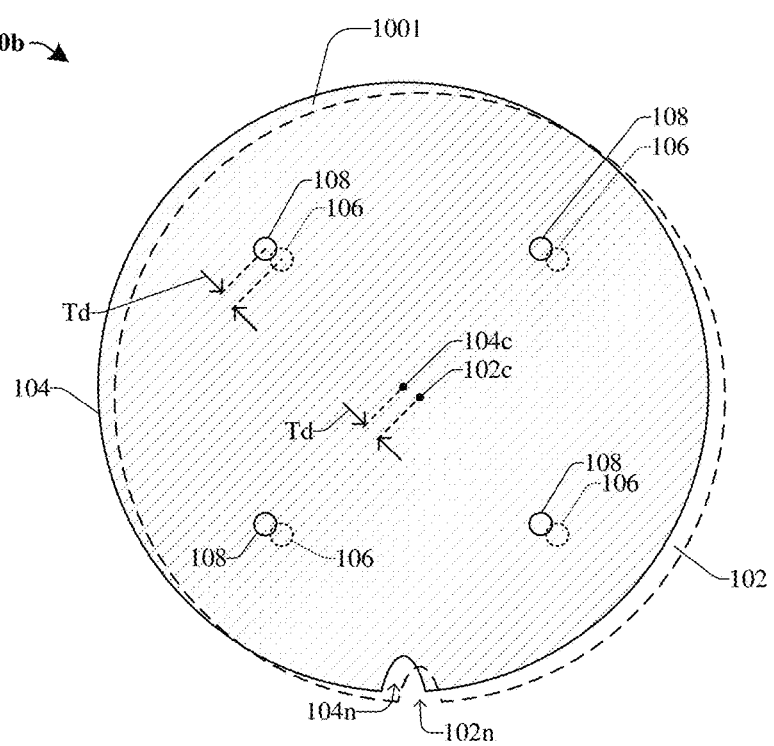

As shown in the cross-sectional view 1100a and the top view 1100b respectively of FIGS. 11A and 11B, the semiconductor wafer 104 is bonded to the handle wafer 102. In some embodiments, the semiconductor wafer 104 is bonded to the handle wafer 102 by bonding the bonding structure 130 to the front-side surface 102f of the handle wafer 102. In yet further embodiments, the semiconductor wafer 104 is bonded to the handle wafer 102 by further bonding each upper alignment mark 108 to a corresponding lower alignment mark in the plurality of lower alignment marks 106. In various embodiments, bonding the semiconductor wafer 104 to the handle wafer 102 forms a bonding interface 1102 along the bonding structure 130, the handle wafer 102, the plurality of upper alignment marks 108, and the plurality of lower alignment marks.

In some embodiments, the bonding interface 1102 comprises dielectric-to-dielectric bonds between the bonding structure 130 and the handle wafer 102. In further embodiments, when the lower and upper alignment marks 106, 108 comprise a metal material (e.g., copper, aluminum, titanium, etc.), the bonding interface 1102 may comprise conductor-to-conductor bonds between the alignment marks of the lower and upper alignment marks 106, 108. In yet further embodiments, when the lower and upper alignment marks 106, 108 comprise a dielectric material (e.g., silicon dioxide, silicon oxynitride, silicon nitride, etc.), the bonding interface 1102 may comprise dielectric-to-dielectric bonds between the alignment marks of the lower and upper alignment marks 106, 108.

In some embodiments, a process for bonding the semiconductor wafer 104 to the handle wafer 102 comprises removing the spacer structure (1002 of FIG. 10A) from between the bonding structure 130 and the handle wafer 102, such that the bonding structure 130 faces the front-side surface 102f of the handle wafer 102. Thereafter, the semiconductor wafer 104 is bonded to the handle wafer 102 by, for example, hybrid bonding, eutectic bonding, fusion bonding, any combination of the foregoing, or the like. In yet further embodiments, the semiconductor wafer 104 may be bonded to the handle wafer 102 without performing an optical-alignment process before and/or during the bonding process. By omitting the optical-alignment process, time and/or cost associated with the method may be reduced. In various embodiments, mechanical alignment (as illustrated and/or described in FIGS. 10A and 10B) is performed on the handle wafer 102 and the semiconductor wafer 104 before the bonding process. However, due to processing tool limitations associated with the mechanical alignment, the center 102c of the handle wafer 102 may be laterally offset from the center 104c of the semiconductor wafer 104 by translation distance Td. The translation distance Td may, for example, be non-zero and may be substantially large (e.g., greater than about 44 micrometers (um)). Further, a center of each upper alignment mark in the plurality of upper alignment marks 108 may be laterally offset from a corresponding lower alignment mark in the plurality of lower alignment marks 106 by the translation distance Td. In yet further embodiments, after the bonding process, the notch 104n of the semiconductor wafer 104 may be shifted from the notch 102n of the handle wafer 102 by a rotation shift (not shown) that may, for example, be non-zero. In such embodiments, the center of each upper alignment mark in the plurality of upper alignment marks 108 may be shifted from a corresponding lower alignment mark in the plurality of lower alignment marks 106 by the rotation shift (not shown).

Figure 12A:
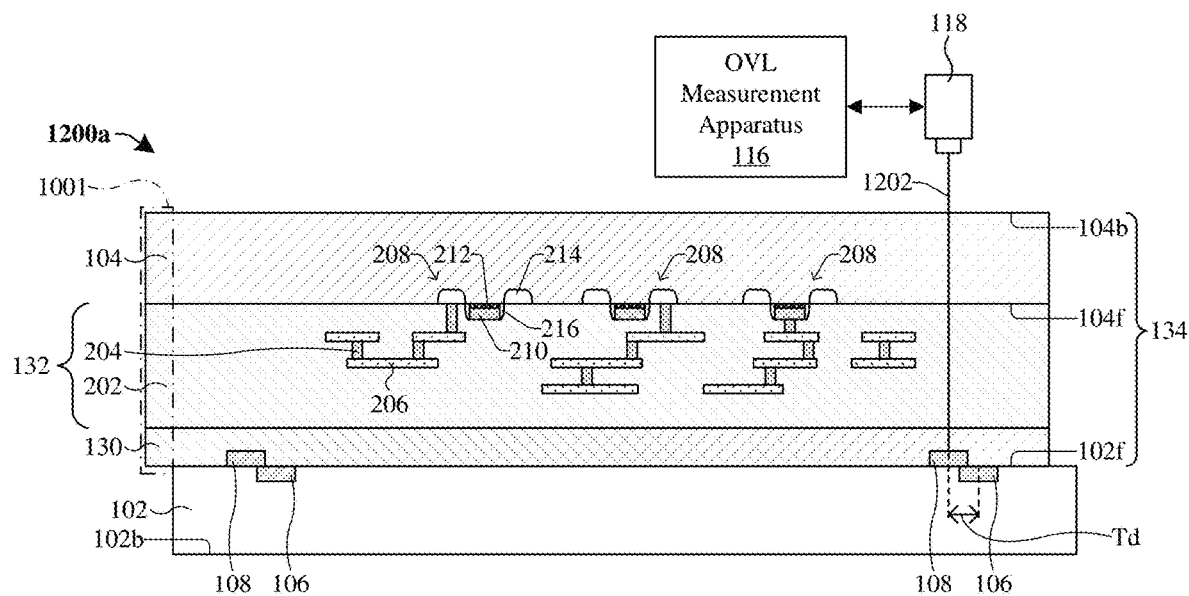
Figure 12B:
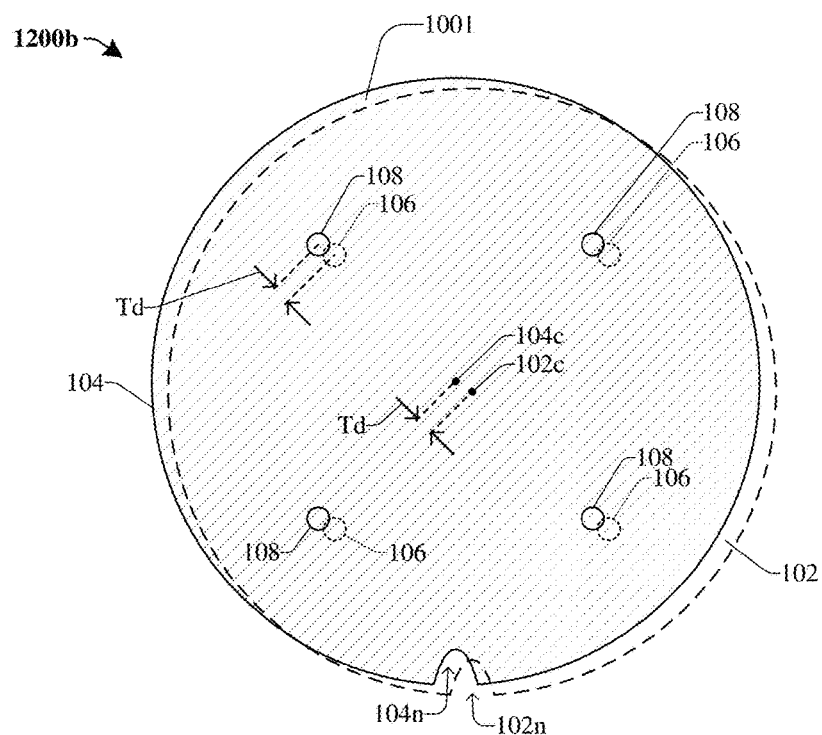

As shown in the cross-sectional view 1200a and the top view 1200b respectively of FIGS. 12A and 12B, an OVL measurement is performed on the handle wafer 102 and the semiconductor wafer 104 to measure and/or determine an OVL shift (e.g., a translation shift and/or a rotation shift) between the handle wafer 102 and the semiconductor wafer 104. In some embodiments, the OVL measurement apparatus 116 is configured to measure and/or determine the OVL shift between the handle wafer 102 and the semiconductor wafer 104 by virtue of the lower and upper alignment marks 106, 108. For example, the OVL measurement apparatus 116 may comprise a light sensor 118 that illuminates light 1202 (e.g., visible light and/or IR light) from the semiconductor wafer 104 to the handle wafer 102, or vice versa. In yet further embodiments, the light sensor 118 may be configured to move over and scan across the back-side surface 104b of the semiconductor wafer 104 in order to determine a location of each alignment mark in the plurality of lower and upper alignment marks 106, 108. Thereafter, the OVL measurement apparatus 116 and/or a controller (e.g., the controller 112 of FIG. 1A) (not shown) may use the location of each alignment mark to determine the OVL shift between the handle wafer 102 and the semiconductor wafer 104. In such embodiments, the OVL measurement apparatus 116 may be configured to determine a translation distance Td and/or a rotation shift (not shown) between each upper alignment mark 108 and a corresponding lower alignment mark 106.

In various embodiments, the light 1202 illuminated by the light sensor 118 may be visible light, such that the light sensor 118 may be configured as an optical microscope or another suitable device. In such embodiments, the light sensor 118 is configured to emit the light 1202 from the back-side surface 104b of the semiconductor wafer 104 to the front-side surface 102f of the handle wafer 102. In yet further embodiments, the light 1202 emitted by the light sensor 118 may be IR light, such that the light sensor 118 is configured as an IR light sensor or another suitable device. In such embodiments, the light sensor 118 is configured to emit the light 1202 from a back-side surface 102b of the handle wafer 102 to the front-side surface 104f of the semiconductor wafer 104 (not shown).

Figure 12C:
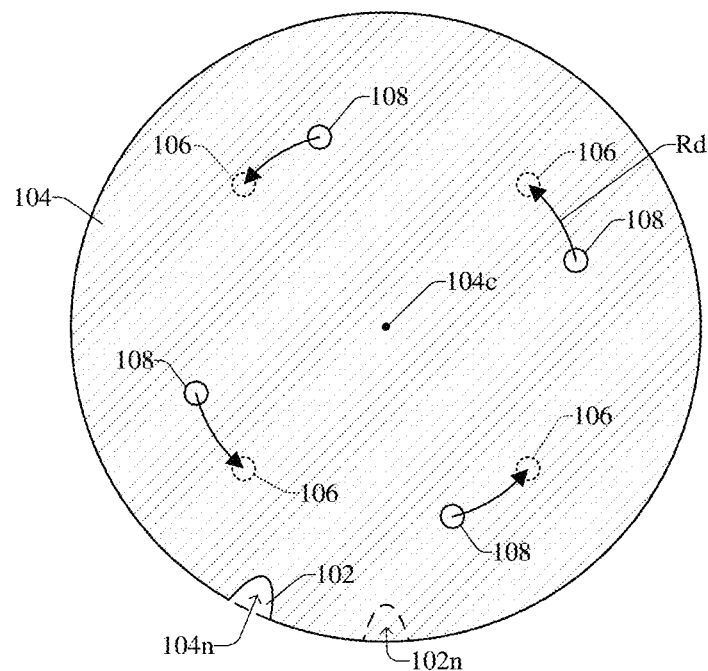

FIG. 12C illustrates a top view 1200c corresponding to some alternative embodiments of the cross-sectional view 1200a of FIG. 12A. As illustrated in FIG. 12C, each upper alignment mark in the plurality of upper alignment marks 108 is shifted from a corresponding lower alignment mark in the plurality of lower alignment marks 106 by a rotation shift Rd. In various embodiments, the rotation shift Rd is non-zero. The OVL measurement apparatus (116 of FIG. 12A) is configured to measure and/or determine the rotation shift Rd as illustrated and/or described in FIG. 12A.

Figure 12D:
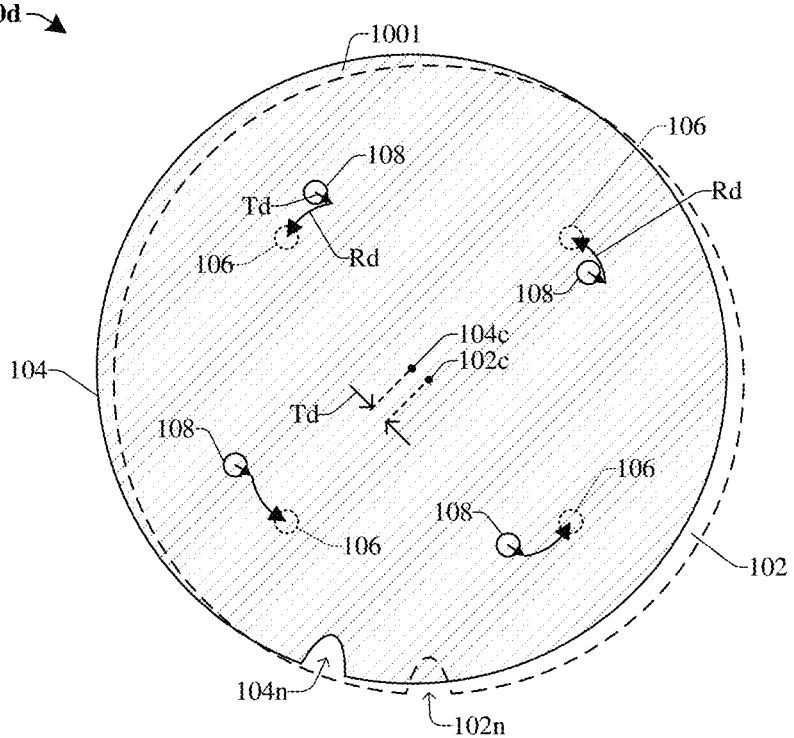

FIG. 12D illustrates a top view 1200d corresponding to yet another alternative embodiment of the cross-sectional view 1200*a* of FIG. 12A. As illustrated in FIG. 12D, each upper alignment mark in the plurality of upper alignment marks 108 may be shifted from a corresponding lower alignment mark in the plurality of lower alignment marks 106 by both the rotation shift Rd and the translation distance Td. In such embodiments, the OVL measurement apparatus (116 of FIG. 12A) is configured to measure and/or determine both the rotation shift Rd and the translation distance Td as illustrated and/or described in FIG. 12A.

Figure 13:
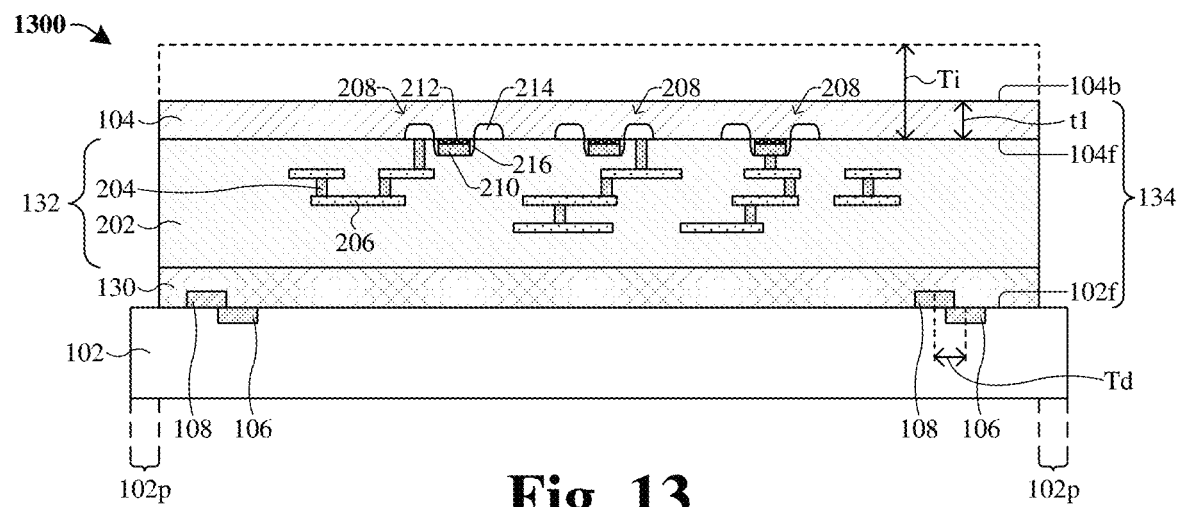

As illustrated in the cross-sectional view 1300 of FIG. 13, a thinning process is performed on the semiconductor wafer 104, thereby reducing a thickness of the semiconductor wafer 104. In some embodiments, the thinning process may reduce an initial thickness Ti of the semiconductor wafer 104 to a thickness t1. In various embodiments, the thickness t1 may be within a range of about 0.5 to 10 micrometers (um), or another suitable thickness value. In yet further embodiments, the thinning process may completely remove the semiconductor wafer 104, such that the thickness t1 has a value of zero (e.g., see FIG. 20). In such embodiments, a semiconductor substrate (not shown) may be disposed between the first interconnect structure 132 and the semiconductor wafer 104 before the thinning process is preformed, such that the first plurality of FEOL semiconductor devices 208 are disposed within/on the semiconductor substrate (not shown). In further embodiments, the thinning process may include performing a CMP process, a mechanical grinding process, another suitable thinning process, or any combination of the foregoing.

Further, as illustrated in the cross-sectional view 1300 of FIG. 13, a trimming process may be performed on the semiconductor wafer 104. In such embodiments, the trimming process removes a portion of the first IC structure 134 from over a peripheral region 102*p* of the handle wafer 102. In various embodiments, the trimming process may, for example, utilize a trimming saw, a trimming laser, another suitable trimming device, or any combination of the foregoing. In yet further embodiments, the trimming process may remove the outer region (1001 of FIGS. 12A and 12B) of the semiconductor wafer 104 and/or may remove the notch (104*n* of FIGS. 12A and 12B) of the semiconductor wafer 104. In some embodiments, after the trimming process a diameter of the semiconductor wafer 104 may be less than a diameter of the handle wafer 102. In yet further embodiments, after the thinning process and/or trimming process, an OVL measurement is performed on the handle wafer 102 and the semiconductor wafer 104 to measure and/or determine an OVL shift by virtue of the lower and upper alignment marks 106, 108 (as illustrated and/or described in FIGS. 12A-12D). This may be in addition to or as an alternative to the OVL measurements described with regard to FIGS. 12A-12D.

In yet further embodiments, after performing the thinning process and/or the trimming process, an APC unit (e.g., 126 of FIG. 1A) is configured to perform a photolithography alignment process (i.e., a calibration process) on a photolithography tool (124 of FIG. 14) according to the measured OVL shift. In such embodiments, the APC unit is configured to adjust parameters of the photolithography tool, such as laterally shifting and/or rotationally shifting a field of view of the photolithography tool and/or a photomask of the photolithography tool by the translation distance and/or the rotation shift. This, in part, compensates for the measured OVL shift, such that subsequent photolithography process(es) are aligned according to the lower and upper alignment marks 106, 108.

Figure 14:
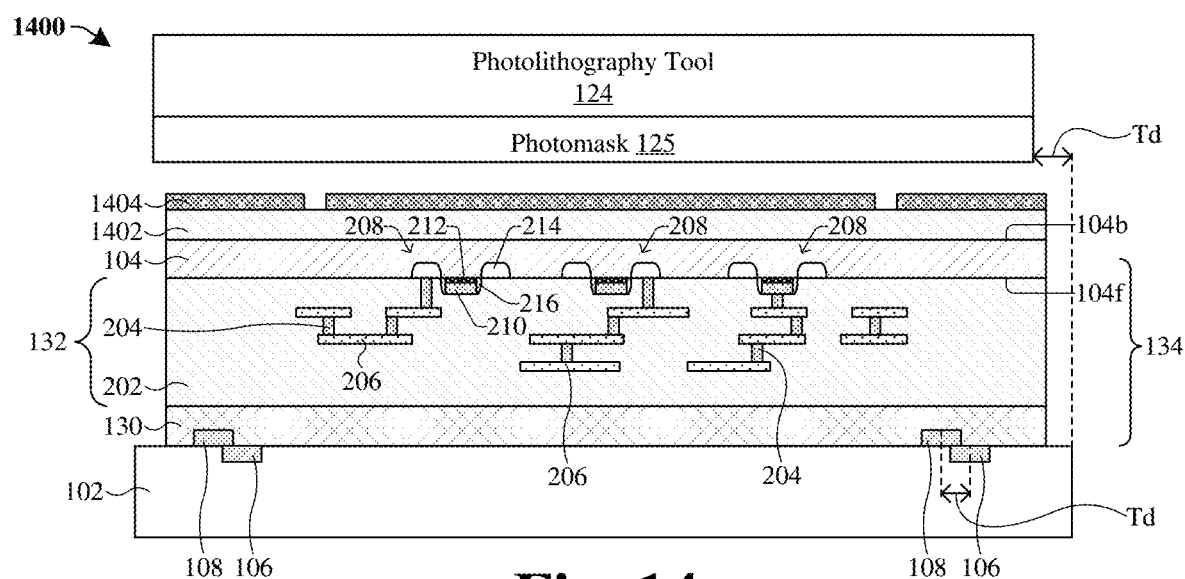

As illustrated in the cross-sectional view 1400 of FIG. 14, an upper dielectric layer 1402 is formed over the semiconductor wafer 104, and an upper patterned masking layer 1404 is formed over the upper dielectric layer 1402. In some embodiments, forming the upper dielectric layer 1402 may include depositing the upper dielectric layer 1402 on the back-side surface 104*b* of the semiconductor wafer 104. In various embodiments, the upper dielectric layer 1402 may be deposited by, for example, PVD, CVD, ALD, or another suitable growth or deposition process. The upper dielectric layer 1402 may, for example, be or comprise silicon dioxide, a low-k dielectric material, another dielectric material, or any combination of the foregoing.

In various embodiments, the upper patterned masking layer 1404 may be formed by utilizing a photolithography tool 124 that compensates for the OVL shift between the handle wafer 102 and the semiconductor wafer 104 (e.g., as a result of the bonding process of FIGS. 11A and 11B). In some embodiments, forming the upper patterned masking layer 1404 may include: depositing a masking layer (not shown) (e.g., positive/negative photoresist, hardmask, etc.) over the upper dielectric layer 1402; performing a photolithography process, via the photolithography tool 124, to expose the masking layer to patterned radiation with a pattern of a photomask 125; and developing the masking layer to form the upper patterned masking layer 1404. In such embodiments, a controller (e.g., 112 of FIG. 1A) is configured to adjust parameters of the photolithography tool 124 according to the OVL shift determined and/or measured by the OVL measurement apparatus (e.g., 116 of FIG. 12A). The photolithography tool 124 may, for example, shift a location of the photomask 125 according to the measured OVL shift (i.e., laterally shift and/or rotationally shift the photomask 125 according to the OVL shift). This, in part, ensures that the pattern of the photomask 125 is aligned according to the upper and lower alignment marks 108, 106, such that one or more patterned layers formed as a result of the upper patterned masking layer 1404 are aligned with structures and/or layers of the first IC structure 134.

In yet further embodiments, the photolithography tool 124 may, for example, laterally shift the photomask 125 by the translation distance Td, thereby compensating for the OVL shift between the handle wafer 102 and the semiconductor wafer 104 as a result of the bonding process of FIGS. 11A and 11B. In various embodiments, the translation distance Td is substantially large (e.g., greater than about 44 um) and may be equal to or greater than a misalignment threshold of the photolithography tool 124. Because the photolithography tool 124 is configured to shift the photomask 125 according to the OVL measurement, the bonded semiconductor wafer 104 and the handle wafer 102 are not rejected for subsequent processing steps. This, in part, increases a device yield.

Figure 15:
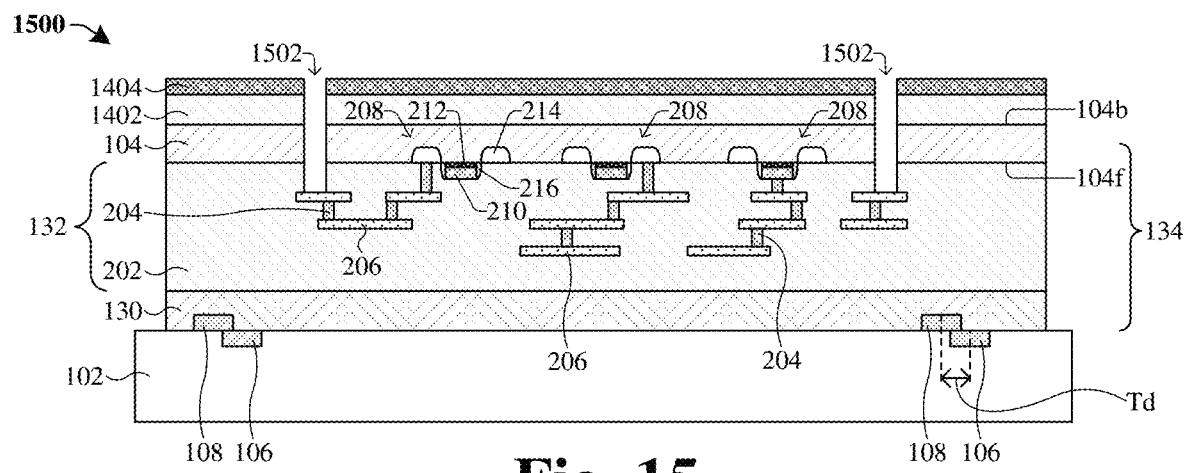

As illustrated in the cross-sectional view 1500 of FIG. 15, a patterning process is performed on the upper dielectric layer 1402 and the first IC structure 134, thereby forming a plurality of openings 1502. In some embodiments, the patterning process includes: performing an etching process on the upper dielectric layer 1402, the semiconductor wafer 104, and the interconnect dielectric structure 202 of the first interconnect structure 132 according to the upper patterned masking layer 1404, thereby forming the plurality of openings 1502; and performing a removal process (not shown) to remove the upper patterned masking layer 1404. In further embodiments, the etching process may be a dry etching process, a wet etching process, an RIE process, some other etching process, or any combination of the foregoing.

Figure 16:
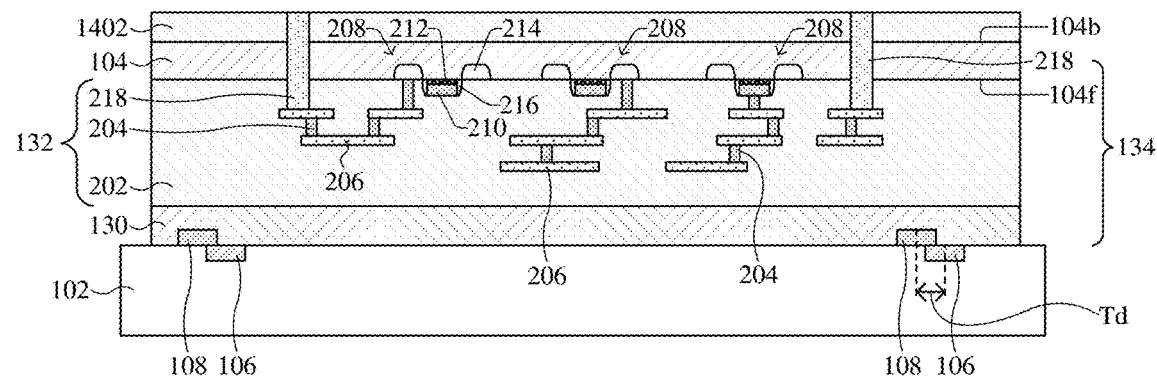

As illustrated in the cross-sectional view 1600 of FIG. 16, a plurality of through-substrate vias (TSVs) 218 are formed over the first interconnect structure 132. In some embodiments, a process for forming the TSVs 218 may comprise: depositing (e.g., by CVD, PVD, sputtering, electro plating, electroless plating, etc.) a conductive layer (not shown) over the upper dielectric layer 1402 such that the conductive layer fills the openings (1502 of FIG. 15); and performing a planarization process (e.g., a CMP process) into the conductive layer, thereby forming the plurality of TSVs 218. The plurality of TSVs 218 may, for example, be or comprise copper, tungsten, aluminum, another conductive material, or any combination of the foregoing.

In further embodiments, it will be appreciated that a process for forming the plurality of TSVs 218 may include the processing steps of FIGS. 14-16. Therefore, the process for forming the plurality of TSVs includes utilizing the photolithography tool (e.g., 124 of FIG. 15) that has been aligned according to the measured OVL shift. This, in part, ensures that the plurality of TSVs 218 are aligned with the first IC structure 134 and make good electrical connections with conductive features (e.g., conductive wires 206) of the first IC structure 134. Thus, short circuits and/or connection failures between the TSVs 218 and layers of the first IC structure 134 may be mitigated, thereby increasing device yield.

Figure 17:
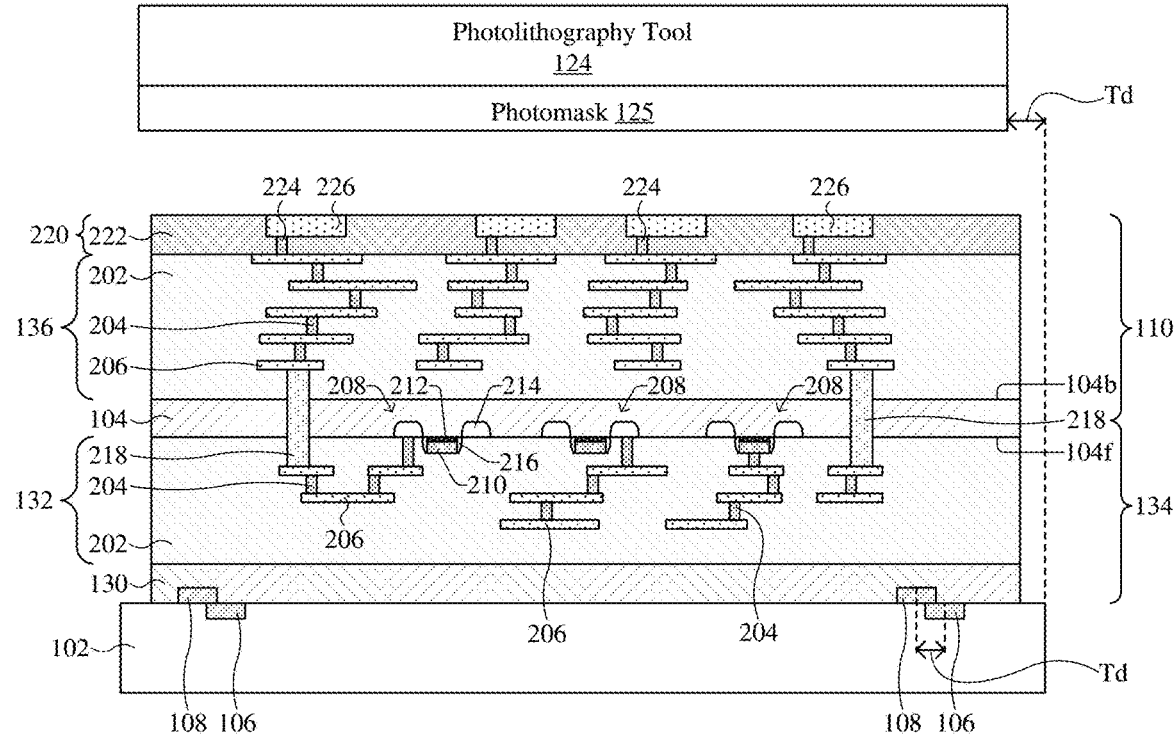

As illustrated in the cross-sectional view 1700 of FIG. 17, a second IC structure 110 is formed over the semiconductor wafer 104. In some embodiments, the second IC structure 110 includes the second interconnect structure 136 and the I/O structure 220. In some embodiments, the upper dielectric layer (e.g., 1402 of FIG. 16) is part of the interconnect dielectric structure 202 of the second interconnect structure 136. In further embodiments, each layer (e.g., each layer of conductive vias 204, conductive wires 206, upper I/O vias 224, and upper I/O contacts 226) of the second IC structure 110 may be referred to as a patterned layer. In yet further embodiments, forming each patterned layer of the second IC structure 110 may include performing one or more photolithography processes via the photolithography tool 124. In such embodiments, the photolithography tool 124 is aligned according to the lower and upper alignment marks 106, 108 (i.e., aligned according to the OVL shift determined and/or measured in FIGS. 12A-12D). For example, each conductive via 204 and/or conductive wire 206 within the second interconnect structure 136 may be formed by utilizing one or more patterned masking layer(s) (not shown) that is formed by the photolithography tool 124 (e.g., as illustrated and/or described in FIG. 14). Thus, layers and/or structures within the second IC structure 110 are formed such that the layers and/or structures of the second IC structure 110 are aligned with layers and/or structures of the first IC structure 134. This, in part, ensures patterned layers of the second IC structure 110 are aligned with layers of the first IC structure 134, thereby mitigating short circuits and/or connection failures between layers of the first and second IC structures 134, 110.

FIGS. 18-21 illustrate cross-sectional views 1800-2100 of some embodiments of acts that may be performed in place of the acts at FIGS. 8A and 8B through 11A and 11B, 12A-12D, and 13-17, such that the method of FIGS. 5-7, 8A and 8B through 11A and 11B, 12A-12D, and 13-17 may alternatively proceed from FIG. 7 to FIGS. 18-21. Thus, in some embodiments, the method of FIGS. 18-21 may correspond to an alternative embodiment of the method of FIGS. 5-7, 8A and 8B through 11A and 11B, 12A-12D, and 13-17.

Figure 18:
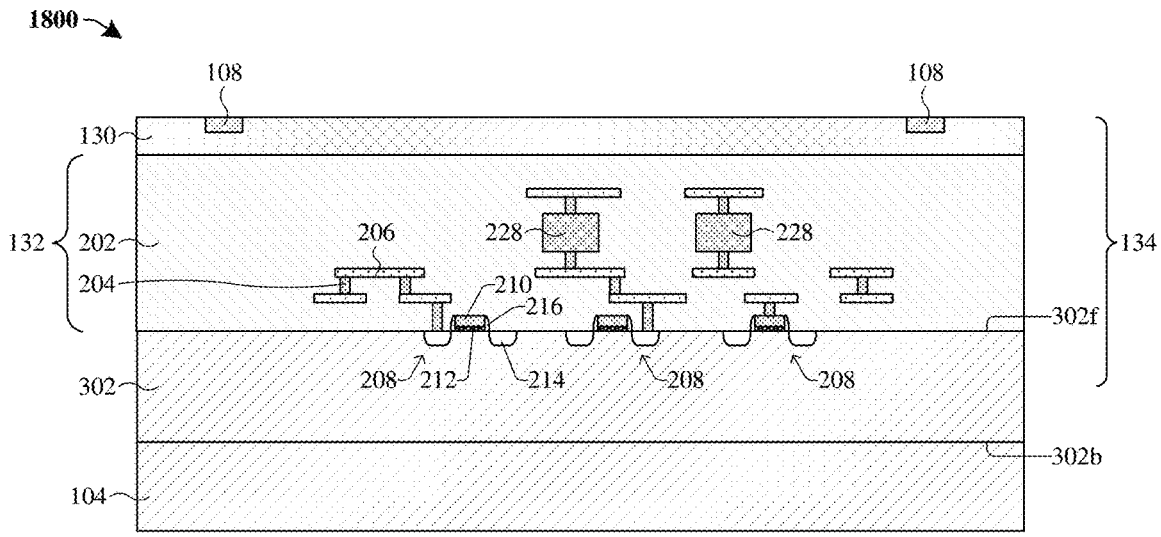
FIGS. 18-21 illustrate cross-sectional views of some alternative embodiments of the method of FIGS. 5-7, 8A and 8B through 11A and 11B, 12A-12D, and 13-17.

As illustrated in the cross-sectional view 1800 of FIG. 18, a semiconductor wafer 104 is provided. A semiconductor substrate 302 is bonded to the semiconductor wafer 104. In some embodiments, an adhesive layer (not shown) is disposed between the semiconductor wafer 104 and the semiconductor substrate 302 before performing the bonding process. Thereafter, a first plurality of FEOL semiconductor devices 208, a first interconnect structure 132, a first plurality of BEOL semiconductor devices 228, a bonding structure 130, and a plurality of upper alignment marks 108 are formed over/on the semiconductor substrate 302. In some embodiments, the first IC structure 134 comprises the semiconductor substrate 302, the first interconnect structure 132, the first plurality of FEOL semiconductor devices 208, the first plurality of BEOL semiconductor devices 228, and the bonding structure 130. In yet further embodiments, the plurality of upper alignment marks 108 is formed as illustrated and/or described in FIGS. 6, 7, 8A, and 8B. In yet further embodiments, the semiconductor wafer 104 may be configured as and/or referred to as a carrier wafer.

Figure 19:
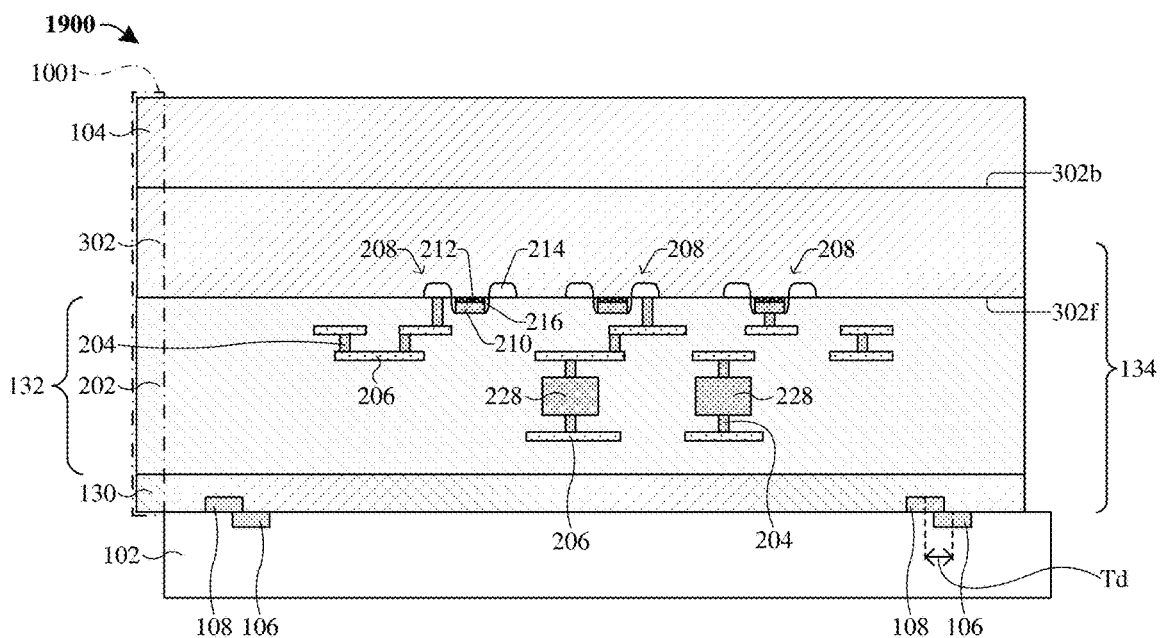

As illustrated in the cross-sectional view 1900 of FIG. 19, a handle wafer 102 is provided and a plurality of lower alignment marks 106 is formed within the handle wafer 102. Thereafter, the semiconductor wafer 104 is bonded to the handle wafer 102. In some embodiments, the plurality of lower alignment marks 106 is formed as illustrated and/or described in FIGS. 9A and 9B. In further embodiments, the semiconductor wafer 104 is bonded to the handle wafer 102 as illustrated and/or described in FIGS. 10A and 10B to FIGS. 11A and 11B. In further embodiments, after bonding the semiconductor wafer 104 to the handle wafer 102, an OVL measurement is performed on the handle wafer 102 and the semiconductor wafer 104 to measure and/or determine an OVL shift between the handle wafer 102 and the semiconductor wafer 104 as illustrated and/or described in FIGS. 12A-12D.

Figure 20:
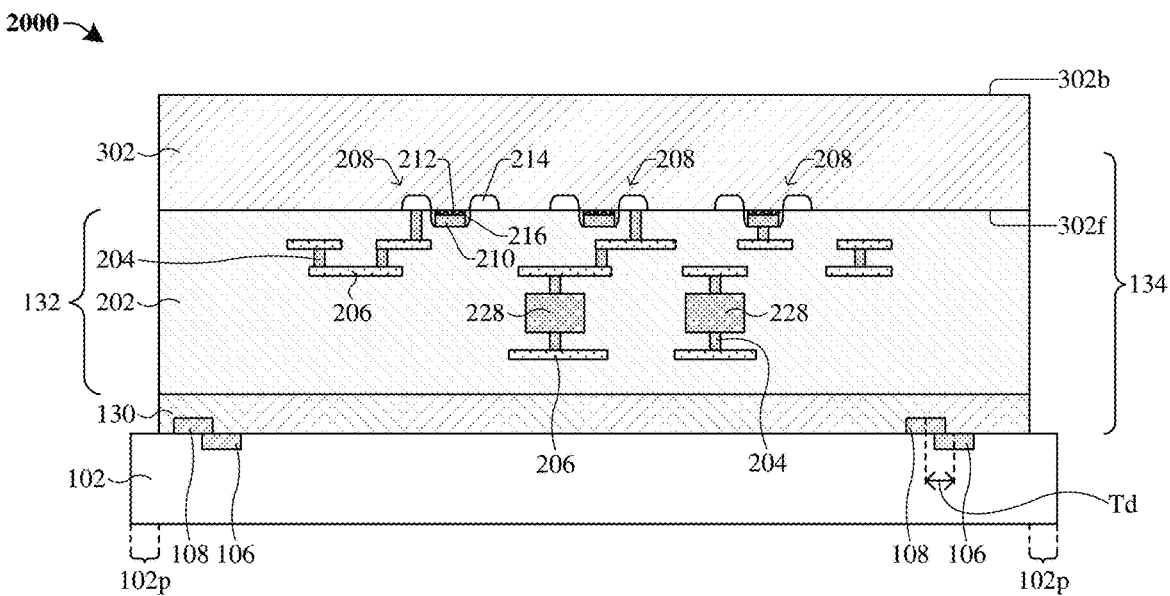

As illustrated in the cross-sectional view 2000 of FIG. 20, a thinning process is performed on the semiconductor wafer (e.g., 104 of FIG. 19). In some embodiments, the thinning process completely removes the semiconductor wafer (e.g., 104 of FIG. 19) and exposes a back-side surface 302b of the semiconductor substrate 302. Thereafter, a trimming process may, for example, be performed on the semiconductor substrate 302 to remove a portion of the first IC structure 134 from over a peripheral region 102p of the handle wafer 102. In some embodiments, the trimming process may be performed as illustrated and/or described in FIG. 13. In various embodiments, the thinning process may, for example, include performing a CMP process, a mechanical grinding process, another suitable thinning process, or any combination of the foregoing.

Figure 21:
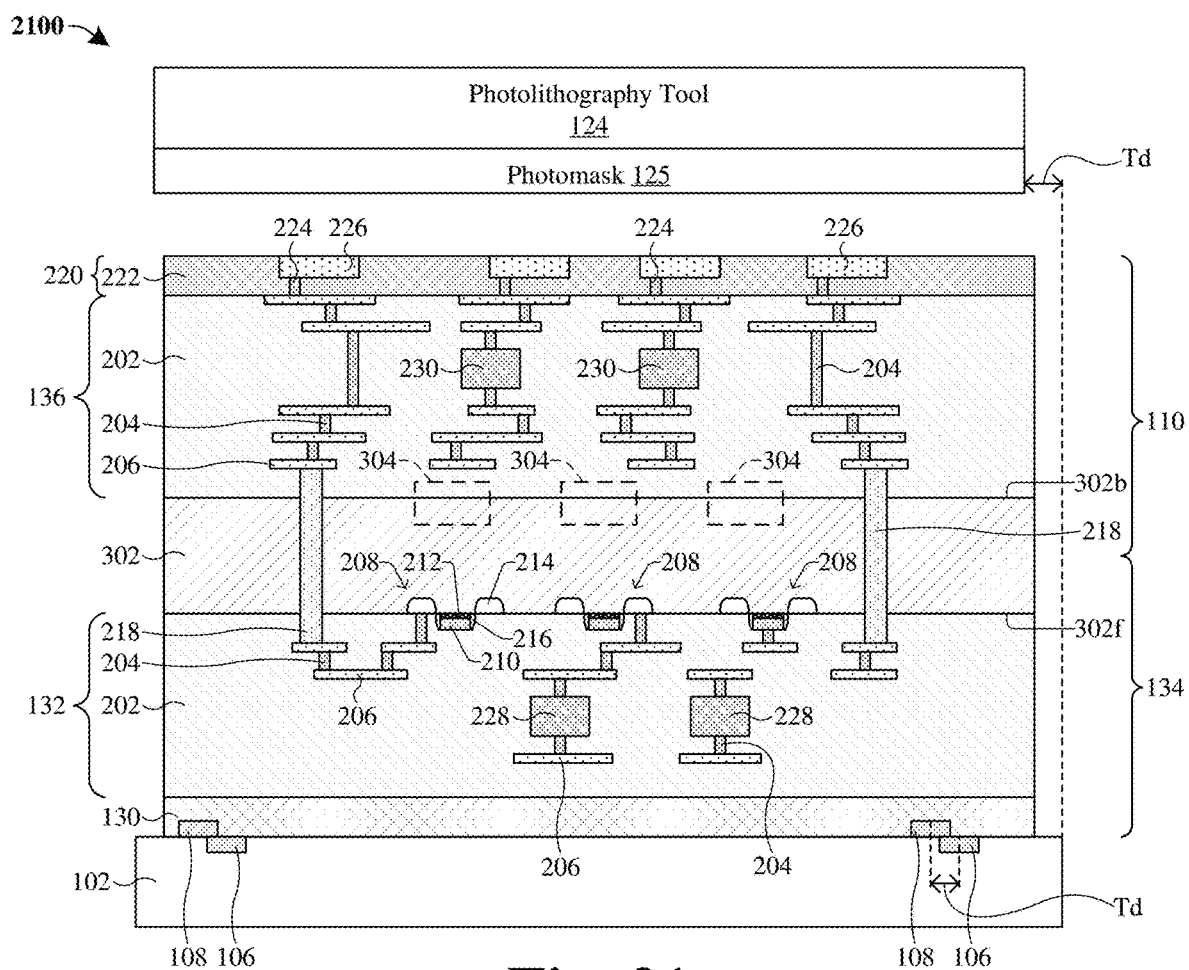

As illustrated in the cross-sectional view 2100 of FIG. 21, a second IC structure 110 is formed over the semiconductor substrate 302. In some embodiments, the second IC structure 110 includes the second interconnect structure 136, a second plurality of FEOL semiconductor devices 304, a second plurality of BEOL semiconductor devices 230, and the I/O structure 220. In further embodiments, forming a patterned layer of the second IC structure 110 may include performing one or more photolithography process(es) via the photolithography tool 124 that is aligned according to the lower and upper alignment marks 106, 108 (i.e., aligned according to the OVL shift determined and/or measured in FIG. 19). For example, the plurality of TSVs 218, the FEOL semiconductor devices 304, the second plurality of BEOL semiconductor devices 230, layers of the second interconnect structure 136, and/or layers of the I/O structure 220 may each be formed by utilizing one or more patterned masking layer(s) (not shown) that is/are formed by the photolithography tool 124 (e.g., as illustrated and/or described in FIG. 14). In such embodiments, layers and/or devices within the second IC structure 110 are formed such that the layers and/or devices of the second IC structure 110 are aligned with layers and/or structures of the first IC structure 134. Thus, patterned layers of the second IC structure 110 are aligned with layers of the first IC structure 134, thereby mitigating short circuits and/or connection failures between layers of the first and second IC structures 134, 110.

Figure 22:
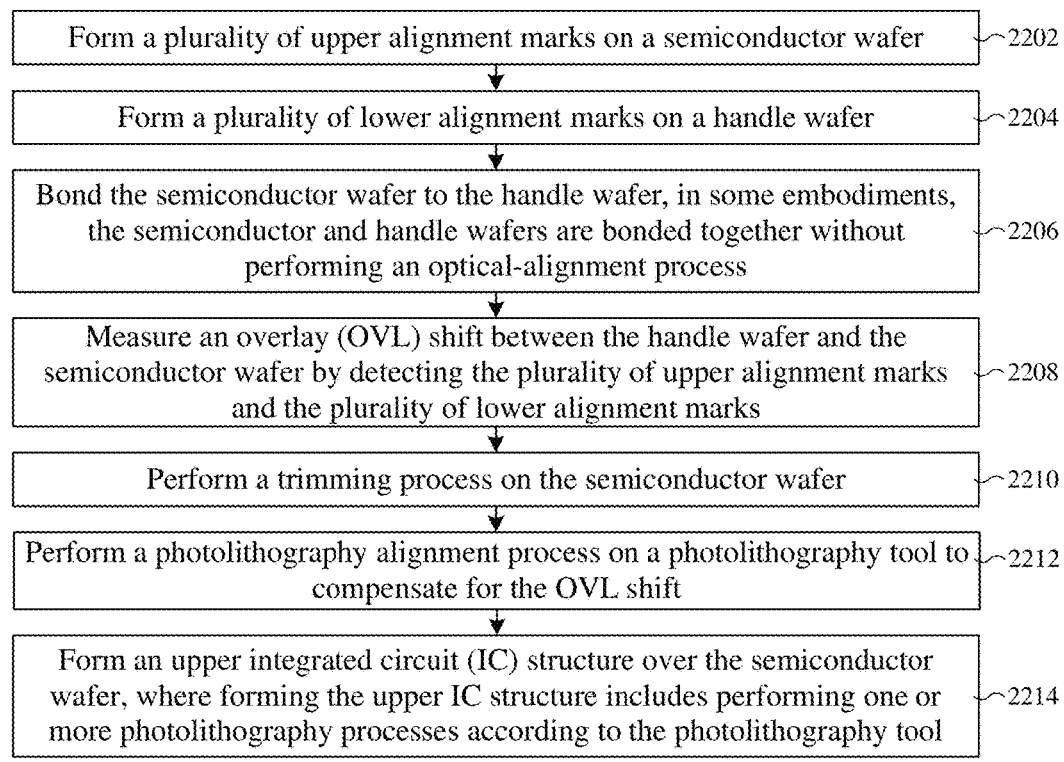
FIG. 22 illustrates some embodiments of a block diagram of a method for bonding a first IC structure to a handle wafer and forming a second IC structure over the first IC structure based on an OVL shift measured between the handle wafer and the first IC structure.

FIG. 22 illustrates a flow diagram of some embodiments of a method 2200 for bonding a first IC structure to a handle wafer, and forming a second IC structure of the first IC structure based on an overlay (OVL) shift measured between the handle wafer and the first IC structure.

While the method 2200 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2202, a plurality of upper alignment marks is formed on a semiconductor wafer. FIGS. 5-7, 8A, and 8B illustrate various views corresponding to some embodiments of act 2202. Further, FIG. 18 illustrates a cross-sectional view 1800 corresponding to some alternative embodiments of act 2202.

At act 2204, a plurality of lower alignment marks is formed on a handle wafer. FIGS. 9A and 9B illustrate various views corresponding to some embodiments of act 2204.

At act 2206, the semiconductor wafer is bonded to the handle wafer. In some embodiments, the semiconductor wafer and the handle wafer are bonded together without performing an optical-alignment process. FIGS. 10A and 10B to FIGS. 11A and 11B illustrate various views corresponding to some embodiments of act 2206. Further, FIG. 19 illustrates a cross-sectional view corresponding to some alternative embodiments of act 2206.

At act 2208, an OVL shift is measured between the handle wafer and the semiconductor wafer by detecting the plurality of upper alignment marks and the plurality of lower alignment marks. FIGS. 12A-12D illustrate various views corresponding to some embodiments of act 2208.

At act 2210, a trimming process is performed on the semiconductor wafer. FIG. 13 illustrates a cross-sectional view corresponding to some embodiments of act 2210. Further, FIG. 20 illustrates a cross-sectional view corresponding to some alternative embodiments of act 2210.

At act 2212, a photolithography alignment process is performed on a photolithography tool to compensate for the OVL shift. FIGS. 13-14 illustrate cross-sectional views corresponding to some embodiments of act 2212.

At act 2214, an upper IC structure is formed over the semiconductor wafer. The upper IC structure is formed by performing one or more photolithography processes according to the photolithography tool. FIGS. 14-17 illustrate cross-sectional views corresponding to some embodiments of act 2214. Further, FIG. 21 illustrates a cross-sectional view corresponding to some alternative embodiments of act 2214.

Accordingly, in some embodiments, the present disclosure relates to a method for forming a 3D IC structure comprising a first IC structure over disposed between a handle wafer and a second IC structure. The method includes performing a photolithography alignment process on a photolithography tool according to an OVL shift measured between a plurality of lower alignment marks on a handle wafer and a plurality of upper alignment marks on a semiconductor wafer. Further, layers of the second IC structure are formed via the photolithography tool after the photolithography alignment process.

In some embodiments, the present application provides a method for forming a semiconductor structure, the method includes: forming a plurality of upper alignment marks on a semiconductor wafer; forming a plurality of lower alignment marks on a handle wafer and corresponding to the upper alignment marks; bonding the semiconductor wafer to the handle wafer such that centers of the upper alignment marks are laterally offset from centers of corresponding lower alignment marks; measuring an overlay (OVL) shift between the handle wafer and the semiconductor wafer by detecting the plurality of upper alignment marks and the plurality of lower alignment marks; and performing a photolithography process using a photolithography tool to partially form an integrated circuit (IC) structure over the semiconductor wafer, wherein during the photolithography process the photolithography tool is compensatively aligned according to the OVL shift. In an embodiment, the semiconductor wafer is bonded to the handle wafer without optical alignment. In an embodiment, a number of upper alignment marks is equal to a number of lower alignment marks, such that each one of the upper alignment marks corresponds to one of the lower alignment marks. In an embodiment, measuring the OVL shift between the handle wafer and the semiconductor wafer comprises determining a center of the handle wafer by virtue of the plurality of lower alignment marks and determining a center of the semiconductor wafer by virtue of the plurality of upper alignment marks. In an embodiment, detecting the plurality of upper alignment marks and the plurality of lower alignment marks comprises illuminating the semiconductor wafer and the handle wafer with light after bonding the semiconductor wafer to the handle wafer. In an embodiment, the method further includes: forming a first interconnect structure along a front-side surface of the semiconductor wafer; forming a bonding structure on the first interconnect structure, where the bonding structure and the handle wafer meet at a bond interface; and where the plurality of upper alignment marks is formed within the bonding structure, where the plurality of lower alignment marks is formed on a front-side surface of the handle wafer. In an embodiment, after bonding the handle wafer to the semiconductor wafer each upper alignment mark is bonded to at least a portion of a corresponding lower alignment mark. In an embodiment, the method further includes: where after bonding the semiconductor wafer to the handle wafer an outer region of the semiconductor wafer is laterally offset from a circumferential edge of the handle wafer by a non-zero distance in a direction away from a center of the handle wafer; and performing a trimming process on the semiconductor wafer to remove a portion of the semiconductor wafer from above a peripheral region of the handle wafer, where the trimming process removes the outer region of the semiconductor wafer, and where after the trimming process a diameter of the semiconductor wafer is less than a diameter of the handle wafer. In an embodiment, the trimming process is performed before measuring the OVL shift.

In some embodiments, the present application provides a method for forming a semiconductor structure, the method includes: forming a first integrated circuit (IC) structure on a semiconductor wafer, where the first IC structure comprises a first sidewall notch and a plurality of upper alignment marks; forming a plurality of lower alignment marks on a handle wafer, where the handle wafer comprises a second sidewall notch; bonding the semiconductor wafer to the handle wafer without optical-alignment, where the first IC structure and the handle wafer meet at a bond interface, and where the first and second sidewall notches are laterally offset after the bonding process; measuring an overlay (OVL) shift between the handle wafer and the semiconductor wafer, where the measuring includes determining a translation distance and a rotation shift between each upper alignment mark and a corresponding one of the lower alignment marks; performing a photolithography alignment process on a photolithography tool to compensate for the OVL shift; and forming a second IC structure over the semiconductor wafer, where forming the IC structure includes performing a patterning process using the photolithography tool after the photolithography alignment process. In an embodiment, forming the plurality of upper alignment marks includes: forming a patterned masking layer on a bonding structure of the first IC structure; etching the bonding structure according to the patterned masking layer, thereby forming a plurality of openings within the bonding structure; forming an alignment mark layer on the bonding structure and within the plurality of openings; and performing a planarization process into the alignment mark layer, thereby forming the plurality of upper alignment marks. In an embodiment, the photolithography alignment process includes shifting a corresponding photomask according to the translation distance and the rotation shift. In an embodiment, measuring the OVL shift includes using a light sensor to emit visible light from a back-side surface of the semiconductor wafer to a front-side surface of the handle wafer to detect locations of the plurality of upper alignment marks and the plurality of lower alignment marks. In an embodiment, measuring the OVL shift includes using an infrared (IR) light sensor to emit IR light from a back-side surface of the handle wafer to a front-side surface of the semiconductor wafer to detect locations of the plurality of upper alignment marks and the plurality of lower alignment marks. In an embodiment, the upper alignment marks are formed along a front-side surface of the semiconductor wafer. In an embodiment, the method further includes: performing a thinning process on the semiconductor wafer after the bonding process, where the thinning process removes the semiconductor wafer from over the handle wafer. In an embodiment, the bonding process includes performing a mechanical-alignment process between the semiconductor wafer and the handle wafer by virtue of a plurality of wafer pins.

In some embodiments, the present application provides a processing system, including: a bonding apparatus configured to bond a semiconductor wafer to a handle wafer without optical alignment, where a plurality of upper alignment marks are disposed on the semiconductor wafer and a plurality of lower alignment marks are disposed on the handle wafer; an overlay (OVL) measurement apparatus configured to measure an OVL shift between the plurality of upper alignment marks and the plurality of lower alignment marks, where the OVL measurement apparatus comprises a light sensor configured to emit light from the semiconductor wafer to the handle wafer in order to determine a location of each upper and lower alignment marks; a photolithography tool configured to expose a photoresist layer on the semiconductor wafer to patterned radiation; and a controller configured to perform a photolithography alignment process on the photolithography tool according to the OVL shift, where the photolithography alignment process compensates for the OVL shift. In an embodiment, the bonding apparatus includes a transport apparatus configured to mechanically-align the semiconductor wafer over the handle wafer before bonding the semiconductor wafer to the handle wafer, where the transport apparatus comprises a plurality of wafer pins, and where the plurality of wafer pins comprises a first pin that is configured to traverse a track and guide the semiconductor wafer over the handle wafer. In an embodiment, the processing system further includes: a thinning apparatus configured to perform a thinning process on the semiconductor wafer, wherein the thinning apparatus is further configured to perform a trimming process on the semiconductor wafer, where the trimming process removes the semiconductor wafer from above a peripheral region of the handle wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
    forming a plurality of upper alignment marks on a semiconductor wafer;
    forming a plurality of lower alignment marks on a handle wafer and corresponding to the upper alignment marks;
    bonding the semiconductor wafer to the handle wafer such that centers of the upper alignment marks are laterally offset from centers of corresponding lower alignment marks;
    measuring an overlay (OVL) shift between the handle wafer and the semiconductor wafer by detecting the plurality of upper alignment marks and the plurality of lower alignment marks; and
    performing a photolithography process using a photolithography tool to partially form an integrated circuit (IC) structure over the semiconductor wafer, wherein during the photolithography process the photolithography tool is compensatively aligned according to the OVL shift.

2. The method of claim 1, wherein the semiconductor wafer is bonded to the handle wafer without optical alignment.

3. The method of claim 1, wherein a number of upper alignment marks is equal to a number of lower alignment marks, such that each one of the upper alignment marks corresponds to one of the lower alignment marks.

4. The method of claim 1, wherein measuring the OVL shift between the handle wafer and the semiconductor wafer comprises determining a center of the handle wafer by virtue of the plurality of lower alignment marks and determining a center of the semiconductor wafer by virtue of the plurality of upper alignment marks.

5. The method of claim 1, wherein detecting the plurality of upper alignment marks and the plurality of lower alignment marks comprises illuminating the semiconductor wafer and the handle wafer with light after bonding the semiconductor wafer to the handle wafer.

6. The method of claim 1, further comprising:
forming a first interconnect structure along a front-side surface of the semiconductor wafer;
forming a bonding structure on the first interconnect structure, wherein the bonding structure and the handle wafer meet at a bond interface; and
wherein the plurality of upper alignment marks is formed within the bonding structure, and wherein the plurality of lower alignment marks is formed on a front-side surface of the handle wafer.

7. The method of claim 6, wherein after bonding the handle wafer to the semiconductor wafer each upper alignment mark is bonded to at least a portion of a corresponding lower alignment mark.

8. The method of claim 1, further comprising:
wherein after bonding the semiconductor wafer to the handle wafer an outer region of the semiconductor wafer is laterally offset from a circumferential edge of the handle wafer by a non-zero distance in a direction away from a center of the handle wafer; and
performing a trimming process on the semiconductor wafer to remove a portion of the semiconductor wafer from above a peripheral region of the handle wafer, wherein the trimming process removes the outer region of the semiconductor wafer, and wherein after the trimming process a diameter of the semiconductor wafer is less than a diameter of the handle wafer.

9. The method of claim 8, wherein the trimming process is performed before measuring the OVL shift.

10. A method for forming a semiconductor structure, comprising:
forming a first integrated circuit (IC) structure on a semiconductor wafer, wherein the first IC structure comprises a first sidewall notch and a plurality of upper alignment marks;
forming a plurality of lower alignment marks on a handle wafer, wherein the handle wafer comprises a second sidewall notch;
bonding the semiconductor wafer to the handle wafer, wherein the first IC structure and the handle wafer meet at a bond interface, and wherein the first and second sidewall notches are laterally offset after the bonding process;
measuring an overlay (OVL) shift between the handle wafer and the semiconductor wafer, wherein the measuring includes determining a translation distance and a rotation shift between each upper alignment mark and a corresponding one of the lower alignment marks;
performing a photolithography alignment process on a photolithography tool to compensate for the OVL shift; and
forming a second IC structure over the semiconductor wafer, wherein forming the IC structure includes performing a patterning process using the photolithography tool after the photolithography alignment process.

11. The method of claim 10, wherein forming the plurality of upper alignment marks includes:
forming a patterned masking layer on a bonding structure of the first IC structure;
etching the bonding structure according to the patterned masking layer, thereby forming a plurality of openings within the bonding structure;
forming an alignment mark layer on the bonding structure and within the plurality of openings; and
performing a planarization process into the alignment mark layer, thereby forming the plurality of upper alignment marks.

12. The method of claim 10, wherein the photolithography alignment process includes shifting a corresponding photomask according to the translation distance and the rotation shift.

13. The method of claim 10, wherein measuring the OVL shift includes using a light sensor to emit visible light from a back-side surface of the semiconductor wafer to a front-side surface of the handle wafer to detect locations of the plurality of upper alignment marks and the plurality of lower alignment marks.

14. The method of claim 10, wherein measuring the OVL shift includes using an infrared (IR) light sensor to emit IR light from a back-side surface of the handle wafer to a front-side surface of the semiconductor wafer to detect locations of the plurality of upper alignment marks and the plurality of lower alignment marks.

15. The method of claim 10, wherein the upper alignment marks are formed along a front-side surface of the semiconductor wafer.

16. The method of claim 10, further comprising:
performing a thinning process on the semiconductor wafer after the bonding process, wherein the thinning process removes the semiconductor wafer from over the handle wafer.

17. The method of claim 10, wherein the bonding process includes performing a mechanical-alignment process between the semiconductor wafer and the handle wafer by virtue of a plurality of wafer pins.

18. A method for forming an integrated circuit (IC), comprising:
forming a plurality of first alignment marks on a first semiconductor wafer;
forming a plurality of second alignment marks on a second semiconductor wafer;
performing a bonding process to bond the first semiconductor wafer to the second semiconductor wafer, wherein the bonding process comprises disposing the first semiconductor wafer over the second semiconductor wafer and performing a mechanical-alignment process between the first semiconductor wafer and the second semiconductor wafer;
measuring an overly (OVL) shift between the first semiconductor wafer and the second semiconductor wafer by virtue of the first alignment marks and the second alignment marks; and
forming a semiconductor structure over the first semiconductor wafer, wherein forming the semiconductor structure includes performing a patterning process using a photomask, wherein the photomask is aligned according to the OVL shift during the patterning process.

19. The method of claim 18, wherein a thinning process is performed on the second semiconductor wafer before forming the semiconductor structure.

20. The method of claim 18, wherein the bonding process is performed without optical alignment, wherein a light sensor is used to detect the plurality of first alignment marks and the plurality of second alignment marks while measuring the OVL shift.

* * * * *